(12) United States Patent
Das et al.

(10) Patent No.: US 12,130,647 B2
(45) Date of Patent: Oct. 29, 2024

(54) CIRCUITRY FOR DRIVING A LOAD

(71) Applicant: Cirrus Logic International Semiconductor Ltd., Edinburgh (GB)

(72) Inventors: Tejasvi Das, Austin, TX (US); Siddharth Maru, Austin, TX (US); Cory J. Peterson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/508,204

(22) Filed: Oct. 22, 2021

(65) Prior Publication Data
US 2022/0357757 A1    Nov. 10, 2022

Related U.S. Application Data

(60) Provisional application No. 63/227,837, filed on Jul. 30, 2021, provisional application No. 63/193,888,
(Continued)

(51) Int. Cl.
| | | |
|---|---|---|
| G05F 1/56 | (2006.01) | |
| G01R 19/00 | (2006.01) | |
| G01R 27/16 | (2006.01) | |

(52) U.S. Cl.
CPC ........... G05F 1/56 (2013.01); G01R 19/0092 (2013.01); G01R 27/16 (2013.01)

(58) Field of Classification Search
CPC ........ G05F 1/56; G01R 19/0092; G01R 27/16
See application file for complete search history.

(56) References Cited

U.S. PATENT DOCUMENTS 8,311,243 B2 * 11/2012 Tucker ................. H03G 3/3031
330/202
9,578,417 B2 * 2/2017 Ilango .............. G10K 11/17854
(Continued)

FOREIGN PATENT DOCUMENTS

| EP | 2405675 A1 | 1/2012 | |
|----|------------|--------|---|
| EP | 2905974 A1 | 8/2015 | |
| EP | 3343763 A1 * | 7/2018 | ......... H01L 27/0251 |

OTHER PUBLICATIONS

Partial International Search Report and Provisional Opinion, International Application No. PCT/GB2022/050648, mailed Jun. 9, 2022.

*Primary Examiner* — Lincoln D Donovan
*Assistant Examiner* — James G Yeaman
(74) *Attorney, Agent, or Firm* — Jackson Walker L.L.P.

(57) ABSTRACT

The present disclosure relates to circuitry for driving a load. The circuitry comprises: primary driver circuitry coupled to a primary signal path and operable to drive the load with a playback signal in a first mode of operation of the circuitry, wherein a playback signal comprises a signal that drives the load to generate a desired output; auxiliary driver circuitry coupled to an auxiliary signal path; an auxiliary current sense resistor in the auxiliary signal path; and current detection circuitry coupled to the auxiliary current sense resistor and configured to generate a signal indicative of a current through the load. One of the primary driver circuitry and the auxiliary driver circuitry is operable to drive the load with a pilot signal in a second mode of operation of the circuitry, wherein a pilot signal comprises a signal having a predefined frequency or frequency content and a predefined magnitude.

19 Claims, 16 Drawing Sheets

Related U.S. Application Data filed on May 27, 2021, provisional application No. 63/187,129, filed on May 11, 2021, provisional application No. 63/184,644, filed on May 5, 2021.

(56) References Cited

U.S. PATENT DOCUMENTS

| | | | | |
|---|---|---|---|---|
| 9,709,603 | B2* | 7/2017 | Ferguson | G01R 1/30 |
| 10,184,961 | B2* | 1/2019 | Schrom | H02M 3/157 |
| 10,206,037 | B2* | 2/2019 | Chawla | H03F 3/2173 |
| 10,412,797 | B2* | 9/2019 | Lee | H05B 45/38 |
| 10,436,828 | B2* | 10/2019 | Gautama | G01R 27/08 |
| 2014/0003616 | A1* | 1/2014 | Johnson | H04R 29/001 |
| | | | | 381/74 |
| 2014/0198920 | A1 | 7/2014 | Lee | |
| 2020/0348249 | A1* | 11/2020 | Marchais | G01R 27/16 |
| 2021/0219396 | A1* | 7/2021 | Smith | H03F 3/45273 |

* cited by examiner

CIRCUITRY FOR DRIVING A LOAD

The present disclosure claims priority to U.S. Provisional Patent Application Ser. No. 63/184,644, filed May 5, 2021, U.S. Provisional Patent Application Ser. No. 63/187,129, filed May 11, 2021, U.S. Provisional Patent Application Ser. No. 63/193,888, filed May 27, 2021, and U.S. Provisional Patent Application Ser. No. 63/227,837, filed Jul. 30, 2021, each of which is incorporated by reference herein in its entirety.

FIELD OF THE INVENTION

The present disclosure relates to circuitry for driving a load. In particular, the present disclosure relates to circuitry including current detection circuitry for detecting a current through the load.

BACKGROUND

Driver circuitry for driving transducers such as audio transducers (e.g. speakers) or haptic transducers (e.g. actuators such as linear resonant actuators) often includes voltage detection (VMON) and current detection (IMON) circuit blocks, for detecting, respectively, a voltage across the transducer and a current through the transducer while the transducer is being driven by a playback signal such as an audio signal or a haptic waveform. In this context, a playback signal is a drive signal that drives the transducer to generate a desired output such as an audio or haptic output.

The detected voltage and current can be used to calculate, estimate or otherwise determine an impedance of the transducer, which may be a complex impedance having resistive, inductive and capacitive components. The determined impedance may be used in applications such as speaker protection while the playback signal is being provided to the transducer.

FIG. 1 is a schematic diagram showing an example of driver circuitry that includes voltage and current detection circuit blocks. In this example the driver circuitry, shown generally at 100, includes first and second Class D drivers 110, 120 that drive respective Class D output stages 130, 140. A load 150 is coupled between respective output nodes 132, 142 of the Class D output stages 130, 140, and a current sense resistor 160 is coupled in series with the load 150 between the output nodes 132, 142 of the Class D output stages 130, 140.

The driver circuitry 100 further includes a current detection circuit block 170, coupled in parallel with the current sense resistor 160 and configured to generate a current sense signal (e.g. a voltage) indicative of a current through the load 150 while the load is being driven by a playback signal that is provided between the Class D output stages 130, 140. The driver circuitry 100 further includes a voltage detection circuit block 180, coupled in parallel with the load 150 and configured to generate a voltage sense signal (e.g. a voltage) indicative of a voltage across the load 150 when it is being driven by the playback signal.

The current sense signal and the voltage sense signal are received at respective inputs of an impedance and/or inductance measurement block 190, which is configured to calculate, estimate or otherwise determine an impedance and/or an inductance of the load 150 based on the current sense signal and the voltage sense signal.

The current sense resistor 160 is configured to have as small a resistance as possible (typically of the order 0.1Ω), in order to minimise adverse effects such as reduced efficiency and/or distortion in the output of the load, e.g. distortion in an audio output of an audio transducer such as a speaker. Typically the playback signal has a relatively high power, such that the small current sense resistance generates a signal of sufficient amplitude to permit the load current to be measured, estimated or otherwise determined to a required degree of accuracy.

In the example shown in FIG. 1 the driver circuitry includes first and second single-ended Class D output stages 130, 140, and the drive signal is provided as a differential signal at the output nodes of the Class D output stages 130, 140, but it will be appreciated that current and voltage detection circuit blocks of the kind shown in FIG. 1 may also be provided in alternative driver circuitry topologies (e.g. topologies that use a single-ended output stage, or topologies that employ differential or single-ended output stages other than Class D output stages).

In some applications it may be desirable to measure a load impedance or inductance when a playback signal is not being supplied to the transducer. For example, in applications in which a linear resonant actuator (LRA) is driven by driver circuitry, it may be desirable to be able to measure, estimate or otherwise determine an inductance of the LRA in order to sense a position of a movable mass of the LRA. In such applications a change in the inductance of the LRA can be used to detect a change in the position of the mass of the LRA.

For such auxiliary measurements (i.e. measurements that are taken when the load is not being driven by a playback signal) it is desirable to minimise the power consumed in making the measurements. Additionally, where the load is an LRA, it is desirable to avoid using large signal amplitudes for making such auxiliary measurements in order to prevent movement of the LRA's mass while the auxiliary measurement is being made.

Typically the magnitude of a pilot signal (which is a signal of a predefined frequency or frequency content and a predefined magnitude, e.g. a sinusoid having a predefined frequency and peak-to-peak amplitude) that is used to drive the transducer for the purpose of making auxiliary transducer current and/or transducer voltage measurements is significantly lower than the magnitude of the playback signal. For example, a playback signal used to drive the transducer during normal operation in order to generate a desired transducer output may have a peak amplitude of the order of 10 volts, whereas a pilot signal may have a peak amplitude of the order of 1 volt. Thus, the power consumption of the driver circuitry when auxiliary measurements are being made is reduced, as compared to its power consumption in normal operation. However, the level of the current sense signal (e.g. voltage) across the current sense resistor 160 sensed by the current detection circuit block 170 is also reduced, leading to reduced signal-to-noise ratio of the current sense signal and reduced measurement sensitivity.

One approach to increasing the signal-to-noise ratio of the current sense signal and measurement sensitivity when making auxiliary measurements would be to increase the resistance of the current sense resistor 160. However, the higher the resistance of the current sense resistor 160, the higher the power consumption of the circuitry 100 in normal operation, and the more distortion is introduced in the transducer output. Thus, increasing the resistance of the current sense resistor 160 is undesirable.

An alternative approach is to add a switchable auxiliary current sense resistor, having a higher resistance than the current sense resistor 160, to the circuitry 100. The auxiliary current sense resistor could then be selected for use in making auxiliary measurements by actuating a selector switch. However, for such an arrangement to function correctly the selector switch must have a significantly lower impedance than the current sense resistor 160 (e.g. <<0.1 ohm), and thus a very large switch would be required. Such a switch would add parasitic capacitance, which would reduce the efficiency of the circuitry 100 and would also give rise to increased distortion in the transducer output. Additionally, such a switch would occupy a relatively large area of silicon on an integrated circuit die, increasing the physical size and cost of an integrated circuit that implements the circuitry.

SUMMARY

The present disclosure relates to circuitry for driving a load, in which primary driver circuitry is coupled to a first signal path and is used to drive the load (e.g. a transducer such as an audio transducer or a haptic transducer) with a playback signal during a first (normal) mode of operation to produce a desired output, and auxiliary driver circuitry is coupled to an auxiliary signal path, and may be used to drive the load with a pilot signal during a second (auxiliary measurement) mode of operation in which a current through the load is measured, estimated or otherwise determined. The auxiliary signal path includes an auxiliary current sense resistor, and the circuitry includes current detection circuitry coupled to the auxiliary current sense resistor. In a first, normal, mode of operation the primary driver circuitry is operative to provide a playback signal to the load to generate a desired output, and the auxiliary driver circuitry is inoperative. In a second, measurement, mode of operation, either the auxiliary driver circuitry or the primary driver circuitry is operative to supply a pilot tone to the load to permit detection of a current through the load. The other of the auxiliary driver circuitry or the primary driver may be inoperative in the second mode of operation, or alternatively may output a constant DC voltage in order to avoid any DC current flow through the load during operation in the second mode.

According to a first aspect, the invention provides circuitry for driving a load, the circuitry comprising:
primary driver circuitry coupled to a primary signal path and operable to drive the load with a playback signal in a first mode of operation of the circuitry, wherein a playback signal comprises a signal that drives the load to generate a desired output;
auxiliary driver circuitry coupled to an auxiliary signal path;
an auxiliary current sense resistor in the auxiliary signal path; and
current detection circuitry coupled to the auxiliary current sense resistor and configured to generate a signal indicative of a current through the load,
wherein one of the primary driver circuitry and the auxiliary driver circuitry is operable to drive the load with a pilot signal in a second mode of operation of the circuitry, wherein a pilot signal comprises a signal having a predefined frequency or frequency content and a predefined magnitude.

The other of the primary driver circuitry and the auxiliary driver circuitry may be operable to output a constant DC signal in the second mode of operation of the circuitry.

A magnitude of the pilot signal may be lower than a magnitude of the playback signal.

The circuitry may further comprise a primary current sense resistor in the primary signal path.

The auxiliary current sense resistor may have a higher resistance than the primary current sense resistor.

The resistance of the auxiliary current sense resistor may be of the order of 100 times the resistance of the primary current sense resistor.

In the first mode of operation the auxiliary signal path may be set to a high impedance state. In the second mode of operation the primary signal path may be set to a high impedance state.

The primary driver circuitry may comprise Class D output stage circuitry.

The auxiliary signal path may comprise a switch for isolating the auxiliary signal path from the primary signal path.

A bulk node of an NMOS device of the Class D output stage circuitry may be back-biased in the first mode of operation.

The circuitry may include a plurality of resistors, each having a different resistance, for use as the auxiliary current sense resistor.

The plurality of resistors may be selectively couplable to the auxiliary signal path.

The circuitry may include a plurality of instances of auxiliary driver circuitry, each instance of auxiliary driver circuitry being coupled to a respective auxiliary signal path, and each auxiliary signal path may include a respective one of the plurality of resistors.

The circuitry may further comprise additional high impedance driver circuitry configured to supply a DC current to the load in operation of the circuitry in the second mode.

The additional driver circuitry may comprise closed loop driver circuitry or open loop driver circuitry.

The additional driver circuitry may comprise voltage driver circuitry or current driver circuitry.

The additional driver circuitry may comprise open loop current digital to analog converter (DAC) circuitry.

The additional driver circuitry may comprise closed loop voltage driver circuitry.

The circuitry may further comprise a plurality of instances of additional high impedance driver circuitry, each configured to supply a DC current to the load in operation of the circuitry in the second mode.

An output node of the primary signal path may be coupled, in use, to a first terminal of the load. An output node of the auxiliary driver circuitry may be coupled, in use, to a second terminal of the load.

The circuitry may further comprise a switch coupled, in use, between the second terminal of the load and a reference voltage supply. In the first mode of operation the switch may be closed to couple the second terminal of the load to the reference voltage supply. In the second mode of operation the switch may be open.

The auxiliary driver circuitry may comprise voltage driver circuitry.

The voltage driver circuitry may comprise:
amplifier circuitry having an input stage and an output stage, the output stage comprising a plurality of selectable output stage segments and a resistor string comprising a plurality of series-connected resistors.

The output stage may comprise one or more output devices. The or each output device may be configured to control a voltage at an output terminal of the output device based on an input signal received at a control terminal of the output device.

Each of the plurality of selectable output stage segments may comprise a respective output device.

A resistor of the resistor string may be coupled to the output node of each of the output stage segments.

The or each output device may comprise a MOSFET device.

The output stage may further comprise one or more current sinks.

The output stage may comprise a plurality of output devices that are selectively couplable to a single current sink.

The circuitry may comprise a plurality of selectable auxiliary signal paths, each configured to couple an output of the amplifier circuitry to a control terminal of a respective one of the output devices.

The circuitry may further comprise a plurality of selectable feedback paths, each configured to couple an output terminal of a respective one of the output devices to an input of the amplifier circuitry.

The output stage may comprise a single output device and a single current sink.

The circuitry may further comprise a feedback path coupling an input node of the resistor string to an input of the amplifier circuitry.

The circuitry may further comprise a feedback path coupling an output node of the resistor string to an input of the amplifier circuitry.

The circuitry may further comprise a feedback path coupling an intermediate node of the resistor string to an input of the amplifier circuitry.

The circuitry may further comprise voltage detection circuitry configured to generate a signal indicative of a voltage across the load.

The circuitry may further comprise:
impedance measurement circuitry configured to calculate, estimate or otherwise determine an impedance of the load based on the signal indicative of the voltage across the load and the signal indicative of the current through the load; and/or
inductance measurement circuitry configured to calculate, estimate or otherwise determine an inductance of the load based on the signal indicative of the voltage across the load and the signal indicative of the current through the load.

According to a second aspect the invention provides an integrated circuit comprising the circuitry of the first aspect.

According to a third aspect the invention provides a device comprising the circuitry of the first aspect.

The device may comprise, for example, a portable device, a battery powered device, a mobile telephone, a tablet, notebook or laptop computer, a smart speaker, an accessory device, a headset device, smart glasses, headphones, earphones or earbuds, a computer game controller, a virtual reality (VR) or augmented reality (AR) device, eyewear, a wearable device such as a smartwatch, a device with voice control or voice activation functionality, or a smart speaker.

According to a fourth aspect the invention provides circuitry for driving a load, the circuitry comprising:
primary driver circuitry coupled to a primary signal path and operable to supply a playback signal to a first terminal of the load in a first mode of operation of the circuitry;
auxiliary driver circuitry coupled to an auxiliary signal path and operable to supply a pilot signal to a second terminal of the load in a second mode of operation of the circuitry; and
current detection circuitry configured to generate a signal indicative of a current through the load in the second mode,
wherein the auxiliary driver circuitry is inoperative in the first mode of operation and the primary driver circuitry is operative to supply a constant DC voltage in the second mode of operation.

According to a fifth aspect the invention provides circuitry for driving a load, the circuitry comprising:
primary driver circuitry coupled to a primary signal path and operable to supply a primary signal to a first terminal of the load in a first mode of operation of the circuitry and to supply a measurement signal to the first terminal of the load in a second mode of operation of the circuitry;
auxiliary driver circuitry coupled to an auxiliary signal path and operable to supply a constant DC voltage to a second terminal of the load in the second mode of operation of the circuitry, wherein the auxiliary signal path comprises a variable auxiliary current sense resistor; and
current detection circuitry coupled to the variable auxiliary current sense resistor and configured to generate a signal indicative of a current through the load in the second mode.

According to a sixth aspect the invention provides circuitry for driving a load, the circuitry comprising:
primary driver circuitry coupled to a primary signal path and operable to drive the load in a first mode of operation;
auxiliary driver circuitry coupled to an auxiliary signal path and operable to drive the load in a second mode of operation;
an auxiliary current sense resistor in the auxiliary signal path; and
current detection circuitry coupled to the auxiliary current sense resistor and configured to generate a signal indicative of a current through the load,
wherein the auxiliary driver circuitry is inoperative to in the first mode of operation and the primary driver circuitry is inoperative in the second mode of operation.

BRIEF DESCRIPTION OF THE DRAWINGS

Embodiments of the invention will now be described, strictly by way of example only, with reference to the accompanying drawings, of which.

DETAILED DESCRIPTION

Figure 1:
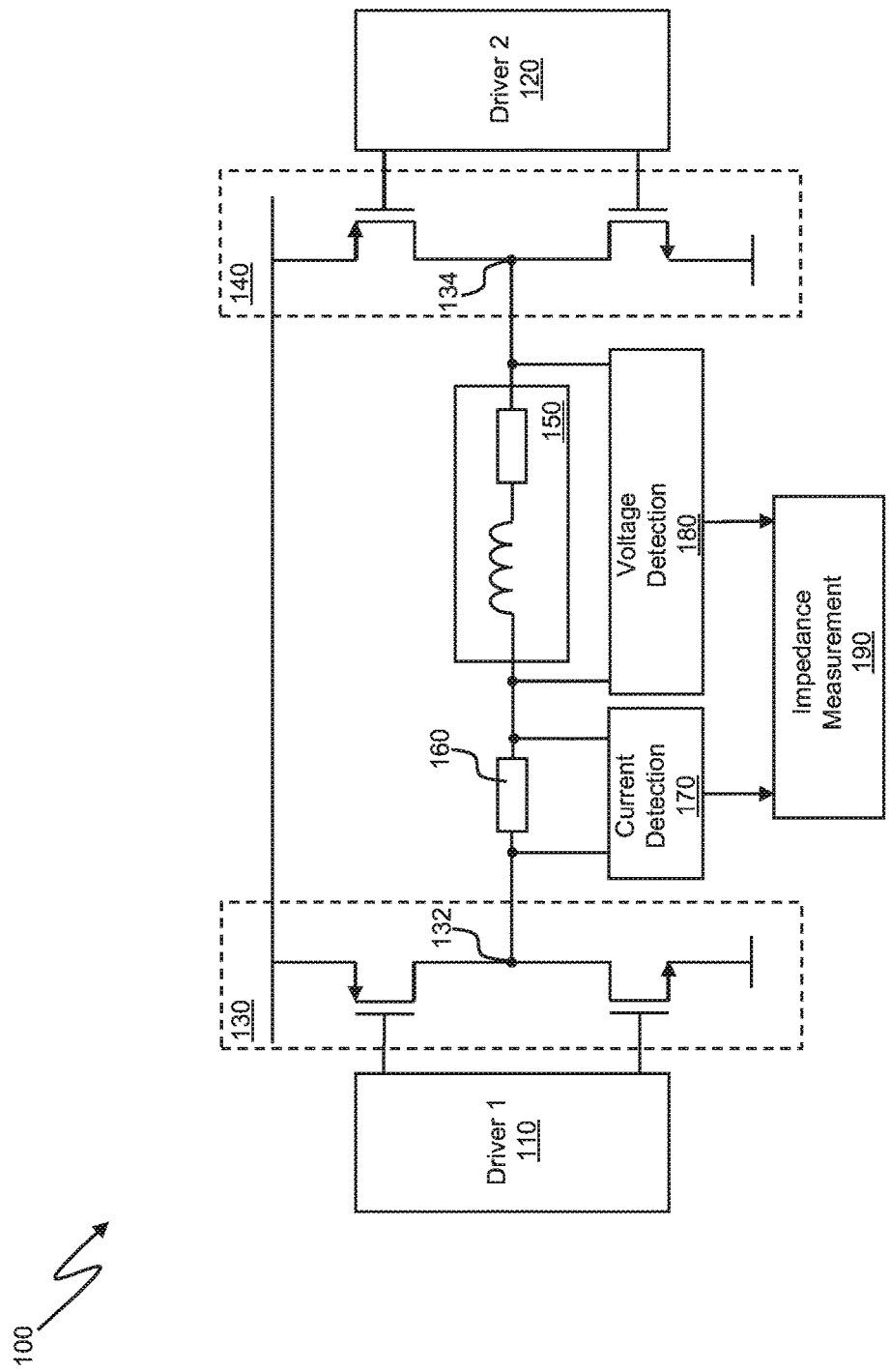
FIG. 1 is a schematic diagram illustrating an example of driver circuitry that includes voltage and current detection circuit blocks.
Figure 2:
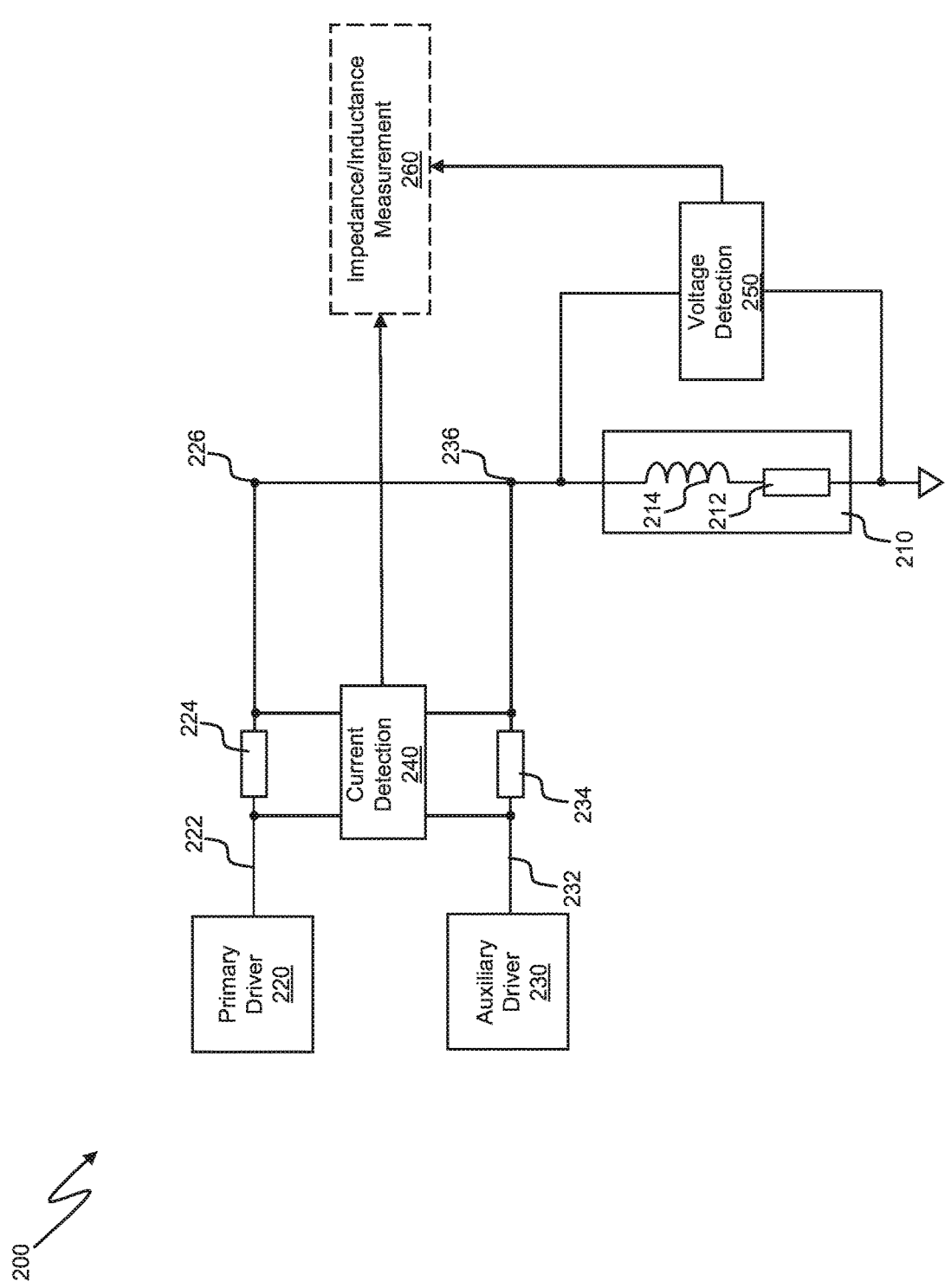
FIG. 2 is a schematic diagram illustrating an example of driver circuitry according to the present disclosure.

FIG. 2 is a schematic diagram illustrating an example of circuitry according to the present disclosure. The circuitry, shown generally at 200 in FIG. 2, is configured to drive a load 210, and comprises primary driver circuitry 220 and auxiliary driver circuitry 230. In the illustrated example the load 210 is modelled as a series combination of a resistive component 212 and an inductive component 214, but it will be appreciated that the load 210 may have other components (e.g. the load 210 may have a capacitive component in addition to, or in place of, the resistive component or the inductive component) and that the load 210 can be modelled as different configurations (e.g. series, parallel) of the components.

The primary driver circuitry 220 is coupled to a primary signal path 222 and is configured to output a playback signal at an output node 226 of the primary signal path 222 to drive the load 210 (when the load 210 is coupled to the circuitry). In the illustrated example the primary signal path 222 includes a primary current sense resistor 224, but in other examples the primary current sense resistor 224 may be omitted.

The auxiliary driver circuitry 230 is coupled to an auxiliary signal path 232 and is configured to output a pilot signal at an output node 236 of the secondary signal path 232 to drive the load 210 (when the load 210 is coupled to the circuitry 200). The auxiliary signal path 232 includes an auxiliary current sense resistor 234. The resistance of the auxiliary current sense resistor 234 is significantly greater than the resistance of the primary current sense resistor 224 (if provided). For example, if the resistance of the primary current sense resistor 224 is 0.1Ω, the resistance of the auxiliary current sense resistor 234 may be 10Ω. More generally, the resistance of the auxiliary current sense resistor 234 may be of the order of 100 times the resistance of the primary current sense resistor 224.

The circuitry 200 further includes current detection circuitry 240, having first and second inputs that are coupled to first and second terminals of the auxiliary current sense resistor 234. If the circuitry 200 includes a primary current sense resistor 224, first and second terminals of the primary current sense resistor 224 are coupled to third and fourth inputs of the current detection circuitry 240.

The current sense circuitry 240 is configured to generate a current sense signal (e.g. a voltage) indicative of a current through the load 210 when the load 210 is being driven by a pilot signal output by the auxiliary driver circuitry 230. If the circuitry 200 includes a primary current sense resistor 224, the current sense circuitry 240 is also configured to generate a current sense signal (e.g. a voltage) indicative of a current through the load 210 when the load 210 is being driven by a playback signal output by the primary driver circuitry 220.

The circuitry 200 further includes voltage detection circuitry 250 which, in operation of the circuitry 200, is coupled in parallel with the load 210. The voltage detection circuitry 250 is configured to generate a voltage sense signal indicative of a voltage across the load 210 when the load 210 is being driven by either a playback signal or a pilot signal.

The circuitry 200 may also include impedance and/or inductance measurement circuitry 260, operative to receive the current sense signal and the voltage sense signal generated, respectively, by the current detection circuitry 240 and the voltage detection circuitry 250 and to calculate, estimate or otherwise determine an impedance and/or an inductance of the load 210 based on the received current sense and voltage sense signals.

In operation of the circuitry 200 in a first, normal, mode of operation, the auxiliary driver circuitry 230 is disabled or deactivated (e.g. by setting the auxiliary signal path 232 to a high-impedance state or by decoupling the auxiliary driver circuitry 230 from a power supply) such that in the first mode of operation the auxiliary driver circuitry 230 is inoperative and does not output the pilot signal to the load 210. The primary driver circuitry 220 is enabled or activated, and outputs a playback signal to the load 210, via the primary signal path 222, to cause the load 210 to generate a desired output, which may be, for example, an audio output if the load 210 is an audio transducer such as a speaker or a haptic output if the load 210 is a haptic transducer such as a linear resonant actuator.

If the primary current sense resistor 224 is provided, the current detection circuitry 240 may output a current sense signal indicative of the current through the load 210, based on the voltage across the primary current sense resistor 224, while the playback signal is being output to the load 210 by the primary driver circuitry 220. The voltage detection circuitry 250 may also output a voltage sense signal indicative of the voltage across the load 210 while the playback signal is being output to the load 210 by the primary driver circuitry 220, and these signals may be used by the impedance and/or inductance measurement circuitry 260 (if provided) to determine an impedance and/or an inductance of the load 210 when driven by the playback signal.

In operation of the circuitry 200 in a second, auxiliary measurement, mode of operation, the primary driver circuitry 220 is disabled or deactivated (e.g. by setting the primary signal path 222 to a high-impedance state or by decoupling the primary driver circuitry 220 from a power supply) such that in the second mode of operation the primary driver circuitry 220 is inoperative and does not output the playback signal to the load 210. The auxiliary driver circuitry 230 is enabled or activated, and outputs a pilot signal to the load 210 via the auxiliary signal path 232. A magnitude of the pilot signal is lower than that of the playback signal that is output by the primary driver circuitry 220 in the normal mode of operation. For example, if the peak amplitude of the playback signal is 10 v, the peak amplitude of the pilot signal may be 1 v.

The current detection circuitry 240 outputs a current sense signal indicative of the current through the load 210, based on the voltage across the auxiliary current sense resistor 234, while the pilot signal is being output to the load 210 by the auxiliary driver circuitry 230. The voltage detection circuitry 250 also outputs a voltage sense signal indicative of the voltage across the load 210 while the pilot signal is being output to the load 210 by the auxiliary driver circuitry 230, and these signals may be used by the impedance and/or inductance measurement circuitry 260 (if provided) to determine an impedance and/or inductance of the load 210 when driven by the pilot signal. The determined impedance and/or inductance may be used by downstream processing circuitry (not shown) for a variety of applications. For example, where the load is an LRA, the determined impedance and/or inductance may be used by the downstream circuitry to determine or estimate the position (or a magnitude of a change in the position) of a mass of the LRA.

Figure 3:
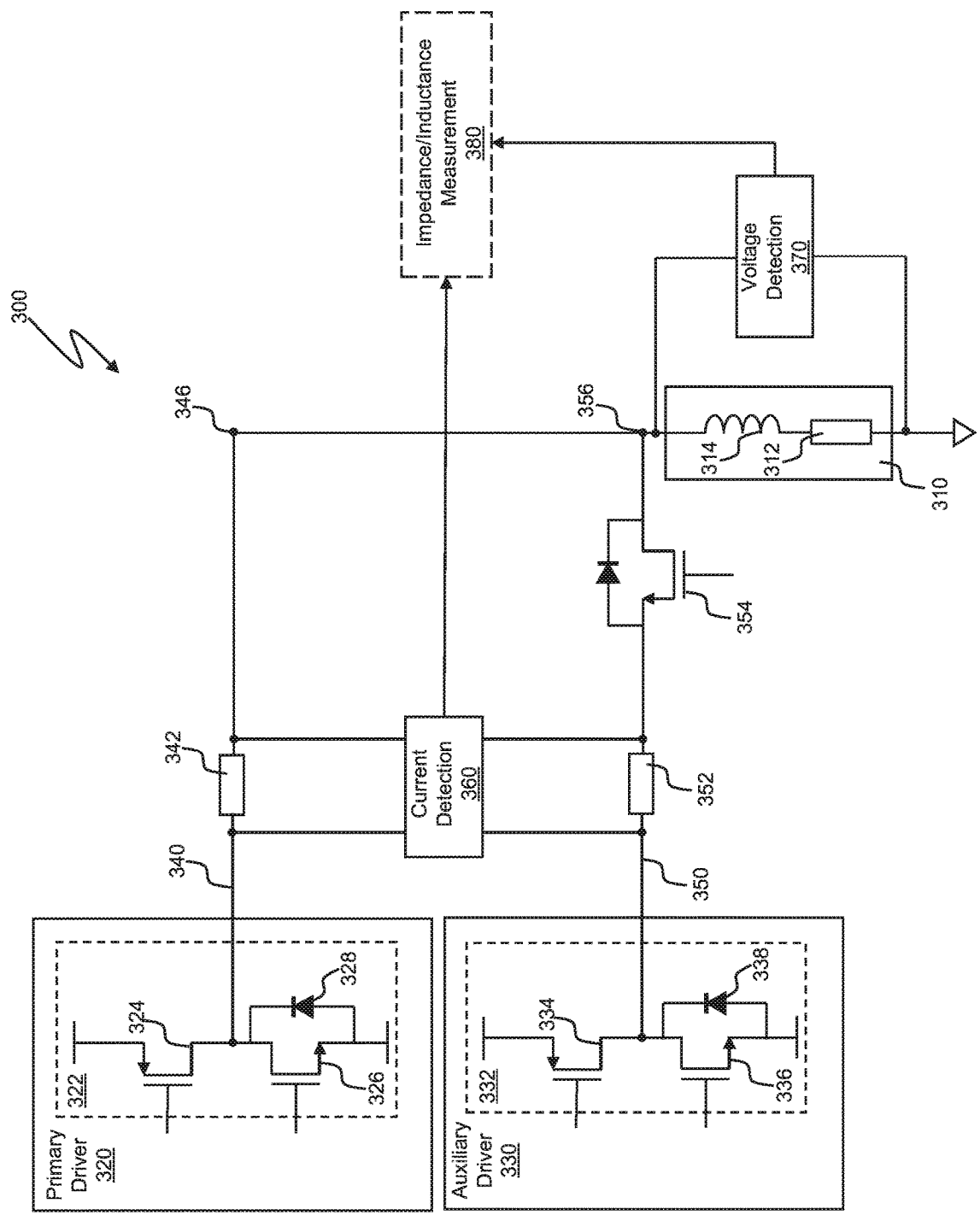
FIG. 3 is a schematic diagram illustrating is a schematic diagram illustrating another example of circuitry according to the present disclosure.

FIG. 3 is a schematic diagram illustrating another example of circuitry according to the present disclosure. The circuitry, shown generally at 300 in FIG. 3, is configured to drive a load 310, and comprises primary driver circuitry 320 and auxiliary driver circuitry 330. In the illustrated example the load 310 is modelled as a series combination of a resistive component 312 and an inductive component 314, but it will be appreciated that the load 310 may have other components (e.g. the load 310 may have a capacitive component in addition to, or in place, of the resistive component or the inductive component) and that the load 310 can be modelled as different configurations (e.g. series, parallel) of the components.

The primary driver circuitry 320 in this example includes a Class D output stage 322, which comprises a PMOS device 324 coupled in series with an NMOS device 326 between a positive power supply rail and a ground or other reference voltage supply rail. An output signal is provided at a node between the PMOS device 324 and the NMOS device 326.

As shown, the PMOS device 324 includes a parasitic body diode 328 coupled between its drain and source terminals. As will be appreciated by those of ordinary skill in the art, the NMOS device 326 will also include a parasitic body diode, but this is not shown in FIG. 3 as it is not pertinent to the present disclosure.

Similarly, the auxiliary driver circuitry 330 in this example includes a Class D output stage 332, which comprises a PMOS device 334 coupled in series with an NMOS device 336 between a positive power supply rail and a ground or other reference voltage supply rail. An output signal is provided at a node between the PMOS device 334 and the NMOS device 336.

The PMOS device 334 includes a body diode 338 coupled between its drain and source terminals. Again, the NMOS device 336 will also include a parasitic body diode, but this is not shown in FIG. 3 as it is not pertinent to the present disclosure.

The primary driver circuitry 320 is coupled to a primary signal path 340 and is configured to output a playback signal at an output node of the primary signal path 340 to drive the load 310 (when the load 310 is coupled to the circuitry 300). In the illustrated example the primary signal path 340 includes a primary current sense resistor 342, but in other examples the primary current sense resistor 342 may be omitted.

The auxiliary driver circuitry 330 is coupled to an auxiliary signal path 350 and is configured to output a pilot signal at an output of the auxiliary signal path 350 to drive the load 310 (when the load 310 is coupled to the circuitry 300). The auxiliary signal path 350 includes an auxiliary current sense resistor 352. The resistance of the auxiliary current sense resistor 352 is significantly greater than the resistance of the primary current sense resistor 342 (if provided). For example, if the resistance of the primary current sense resistor 342 is 0.1Ω, the resistance of the auxiliary current sense resistor 352 may be 10Ω. More generally, the resistance of the auxiliary current sense resistor 352 may be of the order of 100 times the resistance of the primary current sense resistor 342.

The circuitry 300 further includes current detection circuitry 360, having first and second inputs that are coupled to first and second terminals of the auxiliary current sense resistor 352. If the circuitry 300 includes a primary current sense resistor 342, first and second terminals of the primary current sense resistor 342 are coupled to third and fourth inputs of the current detection circuitry 260.

The current detection circuitry 360 is configured to generate a current sense signal (e.g. a voltage) indicative of a current through the load 310 when the load 310 is being driven by a pilot signal output by the auxiliary driver circuitry 330. If the circuitry 300 includes a primary current sense resistor 342, the current sense circuitry 360 is also configured to generate a current sense signal (e.g. a voltage) indicative of a current through the load 310 when the load 310 is being driven by a playback signal output by the primary driver circuitry 320.

The circuitry 300 further includes voltage detection circuitry 370 which, in operation of the circuitry 300, is coupled in parallel with the load 310. The voltage detection circuitry 370 is configured to generate a voltage sense signal indicative of a voltage across the load 310 when the load 310 is being driven by either a playback signal or a pilot signal.

The circuitry 300 may also include impedance and/or inductance measurement circuitry 380, operative to receive the current sense signal and the voltage sense signal generated, respectively, by the current detection circuitry 360 and the voltage detection circuitry 370 and to calculate, estimate or otherwise determine an impedance and/or an inductance of the load 310 based on the received current sense and voltage sense signals.

Like the circuitry 200, the circuitry 300 is operable in a first, normal mode of operation and in a second, auxiliary measurement, mode of operation.

In operation of the circuitry 300 in the first, normal, mode of operation, the auxiliary driver circuitry 330 is disabled or deactivated (e.g. by setting its output to a high-impedance state or by decoupling the auxiliary driver circuitry 330 from a power supply) such that in the first mode of operation the auxiliary driver circuitry 330 is inoperative and does not output the pilot signal to the load 310. The primary driver circuitry 320 is enabled or activated, and outputs a playback signal to the load 310, via the primary signal path 340, to cause the load 310 to generate a desired output, which may be, for example, an audio output if the load 310 is an audio transducer such as a speaker or a haptic output if the load 310 is a haptic transducer such as a linear resonant actuator.

If the primary current sense resistor 342 is provided, the current detection circuitry 360 may output a current sense signal indicative of the current through the load 310, based on the voltage across the primary current sense resistor 342, while the playback signal is being output to the load 310 by the primary driver circuitry 320. The voltage detection circuitry 360 may also output a voltage sense signal indicative of the voltage across the load 310 while the playback signal is being output to the load 310 by the primary driver circuitry 320, and these signals may be used by the impedance and/or inductance measurement circuitry 380 (if provided) to determine an impedance and/or an inductance of the load 310 when driven by the playback signal.

Particularly in applications where the load 310 is inductive (or has an inductive component), the signal in the primary signal path 340 can become negative. Because the auxiliary signal path 350 is coupled to the primary signal path 340 (as both the primary signal path 340 and the auxiliary signal path 350 are coupled to the load 310, in use of the circuitry 300), a negative signal in the primary signal path 340 could be transmitted via the auxiliary signal path 350 to the body diode 338 of the NMOS device 336 of the auxiliary driver circuitry 330, causing the body diode 338 to switch on.

To mitigate this, the auxiliary signal path 350 includes an auxiliary signal path switch 354 (e.g. an NMOS device), which is switched off in the normal mode of operation of the circuitry 300, to isolate the auxiliary signal path 350 from the primary signal path 340 and thus prevent the body diode 338 from switching on if the signal in the primary signal path 240 swings negative. Because the level of the playback signal is relatively low when the circuitry 300 is operating in its normal node, the auxiliary signal path switch 354 does not need to be physically large, and thus occupies a small area in an IC implementation of the circuitry, and can have a resistance that is less than that of the auxiliary current sense resistor (e.g. less than 10Ω), such that it does not materially affect the efficiency of the circuitry 300 when operating in its second mode. Moreover, as the auxiliary signal path switch 354 is not provided in the primary signal path 340, it does not have any effect on the efficiency of the circuitry 300 when operating in its first mode, and does not introduce any distortion into the output of the load 310 when the circuitry 300 is operating in its first mode.

As an alternative, a bulk node of the NMOS device 336 of the auxiliary driver circuitry 330 could be back-biased to prevent its body diode 338 from conducting when the auxiliary signal path 350 is not being used (i.e. in the first mode of operation of the circuitry 300). This approach solves the problem of conduction by the body diode 338 during operation of the circuitry 300 in its first mode, without requiring the auxiliary signal path switch 354.

In operation of the circuitry 300 in the second, auxiliary measurement, mode of operation, the primary driver circuitry 320 is disabled or deactivated (e.g. by setting its output to a high-impedance state or by decoupling the primary driver circuitry 320 from a power supply) such that in the second mode of operation the primary driver circuitry 220 is inoperative and does not output the playback signal to the load 210. The auxiliary driver circuitry 330 is enabled or activated, and outputs a pilot signal to the load 310 via the auxiliary signal path 350. The pilot signal is of lower magnitude than that of the playback signal that is output by the primary driver circuitry 320 in the normal mode of operation (e.g. if the peak amplitude of the playback signal is 10 v the peak amplitude of the pilot signal may be 1 v).

The current detection circuitry 360 outputs a current sense signal indicative of the current through the load 310, based on the voltage across the auxiliary current sense resistor 352, while the pilot signal is being output to the load 310 by the auxiliary driver circuitry 330. The voltage detection circuitry 350 also output a voltage sense signal indicative of the voltage across the load 310 while the pilot signal is being output to the load 310 by the auxiliary driver circuitry 330, and these signals may be used by the impedance and/or inductance measurement circuitry 380 (if provided) to determine an impedance and/or an inductance of the load 310 when driven by the pilot signal. The determined impedance may be used by downstream processing circuitry (not shown) for a variety of applications. For example, where the load is an LRA, the determined impedance may be used by the downstream circuitry to determine or estimate the position (or a magnitude of a change in the position) of a mass of the LRA.

In use of driver circuitry of the kind described above, the current applied to a load can vary over a wide range, which may be as much as one or more orders of magnitude. It is desirable in many applications to be able to sense the load current across the full range of possible load currents. However, this can be challenging, for a number of reasons.

At the lower end of the possible current range, there is reduced cross talk and magnetic/inductive coupling effects to nearby systems such as, for example, load coils of neighbouring or nearby transducers. However, applying current at the lower end of the possible current range to the load limits the sensitivity and signal-to-noise ratio that can be achieved by the current detection circuitry.

One way of alleviating this limitation is to introduce more gain in the processing circuitry (e.g. the current detection circuitry), but this increases the power consumption of the driver circuitry and is thus undesirable.

Alternatively, the resistance of the current sense resistor could be increased to increase sensitivity for lower currents. However, if the current value increases beyond a threshold, saturation and/or clipping problems may arise in the associated processing circuitry (e.g. the current detection circuitry).

Figure 4:
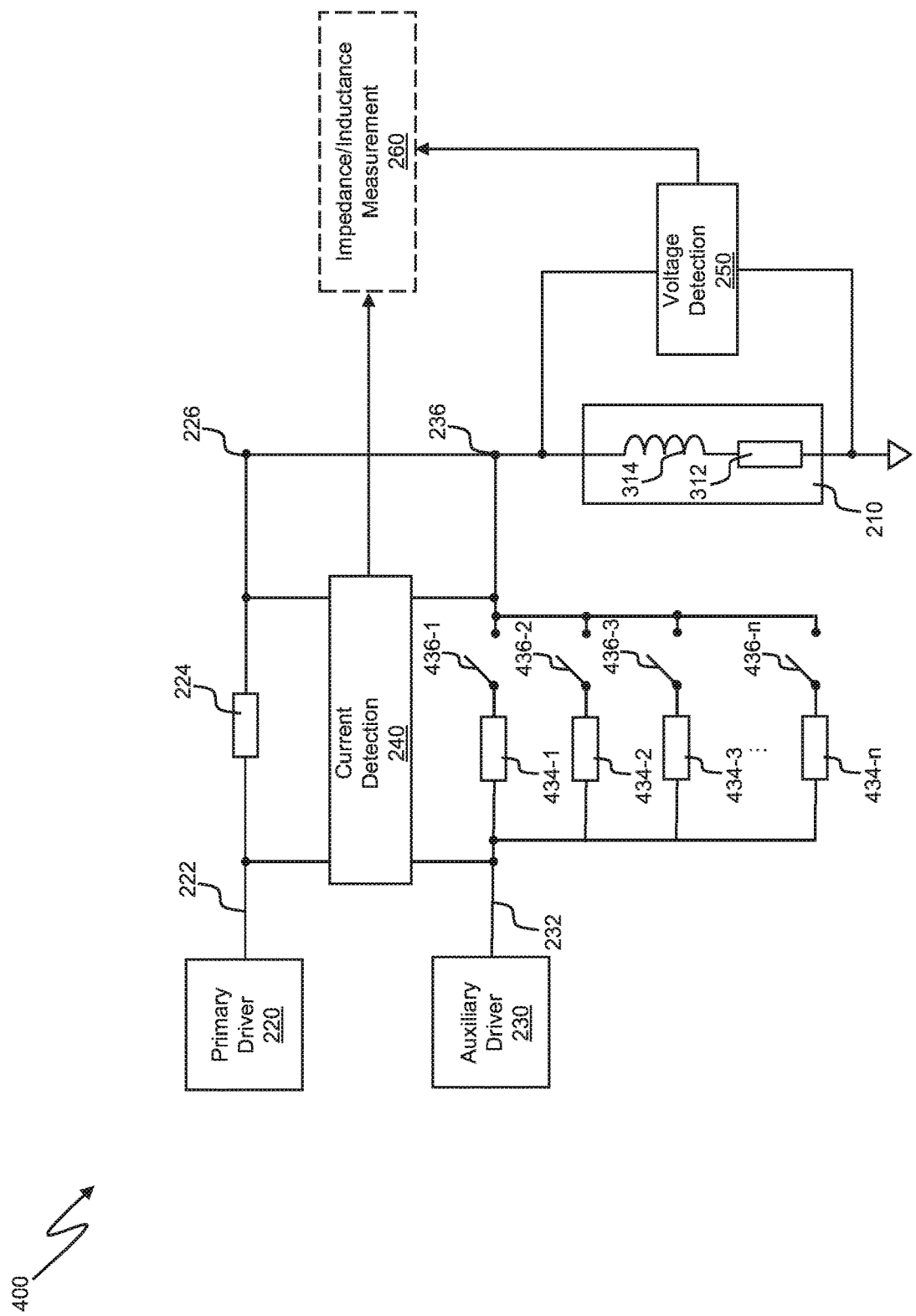
FIG. 4 is a schematic diagram illustrating another example of circuitry according to the present disclosure.

FIG. 4 is a schematic diagram illustrating another example of circuitry according to the present disclosure which can accommodate a wide range of load currents.

The circuitry, shown generally at 400 in FIG. 4, shares many elements in common with the circuitry 200 of FIG. 2. Such common elements are denoted by common reference numerals in FIGS. 2 and 4, and will not be described again here for the sake of clarity and brevity.

The circuitry 400 differs from the circuitry 200 in that, instead of a single auxiliary current sense resistor 234 in the auxiliary signal path 232, the circuitry 400 includes a plurality of resistors 434-1-434-n, each having a different resistance, coupled in series with an associated selector switch 436-1-436-n.

Thus, a first terminal of a first resistor 434-1 is coupled to the output of the auxiliary driver circuitry 230 and to the first input of the current detection circuitry 240. A second terminal of the first resistor 434-1 is coupled to a first terminal of a first selector switch 436-1. A second terminal of the first selector switch 436-1 is coupled to the second input of the current detection circuitry 240, and to the load 210 (when the load 210 is coupled to the circuitry 400).

Each of the other resistors 434-2-434-n and their associated selector switches 436-2-436-n is connected in parallel with the first resistor 434-1 and its associated selector switch 436-1.

Thus, by closing one (or more) of the plurality of selector switches 436-1-436-n, one (or more) of the resistors 434-1-434-n can be coupled to the output of the auxiliary driver circuitry 230 and to the current detection circuitry 240, for use as the auxiliary current sense resistor in operation of the circuitry 400 in its second mode. In this way the resistance used for current sensing in the second mode of operation of the circuitry 400 can be adjusted, e.g. according to the current applied to the load 210.

The circuitry 400, in its first mode, operates in the same manner as the circuitry 200 described above.

In its second mode, the primary driver circuitry 220 is disabled or deactivated, and the auxiliary driver circuitry 230 is enabled or activated. One (or more) of the plurality of resistors 434-1-434-*n* is selected for use as the auxiliary current sense resistor, by switching on the relevant selector switch(es) 434-1-434-*n* with a suitable control signal. The resistor(s) 434-1-434-*n* for use as the auxiliary current sense resistor may be selected statically in advance of operation of the circuitry 400 in its second mode, e.g. according to the current to be applied to the load. Alternatively, the resistor(s) 434-1-434-*n* may be selected dynamically during operation of the circuitry 400 in the second mode, e.g. according to the current applied to the load, such that different ones of the resistors 434-1-434-*n* are selected as the load current changes. For example, when the load current is within a first current range a first resistor 434-1 may be selected, by closing the associated selector switch 436-1. If the load current increases to a level within a second current range, the first resistor 434-1 may be deselected by opening the selector switch 436-1, and a second resistor 434-2, of lower resistance than the first resistor 434-1, may be selected by, closing its associated selector switch 436-2.

As will be appreciated from the foregoing discussion, providing a plurality of selectable resistors of different resistances that can be statically or dynamically selected to be coupled into the auxiliary signal path permits the optimal current sense resistance to be used for a given current applied to the load, which facilitates current sensing to a desired sensitivity without significantly adversely affecting the power consumption or efficiency of the circuitry 400 when it operates in the first mode. Furthermore, because the resistors 434-1-434-*n* and their associated selector switches 436-1-436-*n* are provided in the auxiliary signal path, they do not introduce any distortion to the output of the load 210 when the circuitry 400 operates in its first mode.

The primary driver circuitry 220 and the auxiliary driver circuitry 230 shown in FIGS. 2 and 4 may be implemented using any suitable circuitry. Where the auxiliary driver circuitry 230 are implemented using Class D amplifier circuitry, the auxiliary signal path 232 may include an auxiliary signal path switch 354 of the kind described above with reference to FIG. 3, to prevent body diode conduction in the NMOS device of the auxiliary driver circuitry.

Figure 5:
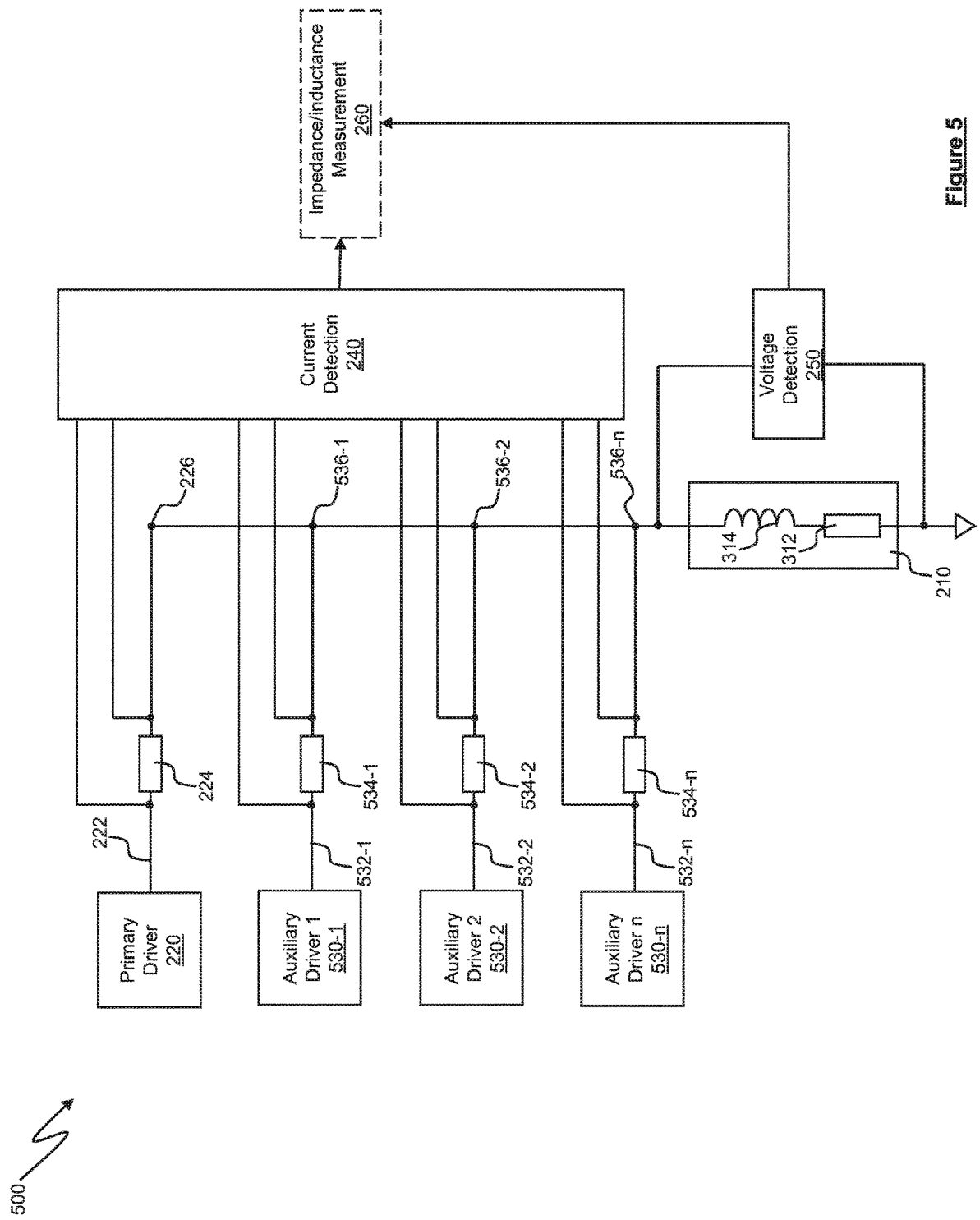
FIG. 5 is a schematic diagram illustrating another example of circuitry according to the present disclosure.

FIG. 5 is a schematic diagram illustrating another example of circuitry according to the present disclosure which can accommodate a range of load currents.

The circuitry, shown generally at 500 in FIG. 5, shares many elements in common with the circuitry 200 of FIG. 2. Such common elements are denoted by common reference numerals in FIGS. 2 and 5, and will not be described again here for the sake of clarity and brevity.

The circuitry 500 includes primary driver circuitry 220 coupled to a primary signal path 222 which, in use of the circuitry 500, is coupled to the load 210. In the illustrated example the primary signal path includes a primary current sense resistor 224 coupled between the primary driver circuitry 220 and the load 210, to which the current detection circuitry 240 is coupled. However, in other examples the primary current sense resistor 224 and the primary current detection circuitry 540 may be omitted.

The circuitry 500 also includes a plurality of instances of auxiliary driver circuitry 530-1-530-*n*, which are each configured to output a pilot signal at a different current level. An output of each instance of auxiliary driver circuitry 530-1-530-*n* is coupled to a respective one of a plurality of auxiliary signal paths 532-1-532-*n*, which are each coupled (in use of the circuitry 500) to the load 210. Each of the auxiliary signal paths 532-1-532-*n* includes a respective auxiliary current sense resistor 534-1-534-*n*. Each auxiliary current sense resistor 534-1-534-*n* has a resistance that is suitable for the current level of the pilot signal output by the associated auxiliary driver circuitry 530-1-530-*n*, and is coupled to the current detection circuitry 240.

The circuitry 500, in its first mode of operation, operates in the same manner as the circuitry 200 described above, with all of the instances of auxiliary driver circuitry 530-1-530-*n* disabled and the primary driver circuitry 220 enabled to output the playback signal.

In the second mode of operation of the circuitry 500, the primary driver circuitry 220 is disabled or deactivated and one of the plurality of instances of auxiliary driver circuitry 530-1-530-*n* is selected by being enabled or activated to output the pilot signal at a desired current level.

While the pilot signal is being output by the selected instance of auxiliary driver circuitry 530-1-530-*n*, the current measurement circuitry 240 outputs a signal (e.g. a voltage) indicative of the current through the load 210, based on the voltage across the current sense resistor 534-1-534-*n* associated with the selected instance of auxiliary driver circuitry 530-1-530-*n*.

The selected instance 530-1-530-*n* of auxiliary driver circuitry may be selected statically, e.g. based on an expected load current. Alternatively, instances of auxiliary driver circuitry 530-1-530-*n* may be selected or enabled dynamically during operation of the circuitry 500 in its second mode, so as to vary the current applied to the load 210. In either case, because each instance of auxiliary driver circuitry 530-1-530-*n* is associated with a respective auxiliary signal path 532-1-532-*n* that contains a suitable auxiliary current sense resistor 534-1-534-*n*, the circuitry 500 can perform current sensing to a desired level of sensitivity for a range of load currents without clipping or saturation, and can accommodate a range of load current levels without adversely affecting the power consumption or efficiency of the primary signal path 222. Furthermore, as each of the auxiliary current sense resistors 534-1-534-*n* is provided in a respective auxiliary signal path 532-1-532-*n*, rather than being part of the primary signal path 222, they do not introduce any distortion to the output of the load 210 when the circuitry 500 operates in its first mode.

The primary driver circuitry 220 and the auxiliary driver circuitry 530-1-530-*n* shown in FIG. 5 may be implemented using any suitable circuitry. Where an instance of auxiliary driver circuitry 530-1-530-*n* is implemented using Class D amplifier circuitry, the associated auxiliary signal path 532-1-532-*n* may include an auxiliary signal path switch 354 of the kind described above with reference to FIG. 3, to prevent body diode conduction in the NMOS device of the respective instance of auxiliary driver circuitry when the circuitry 500 is operating in its first mode of operation.

Figure 6:
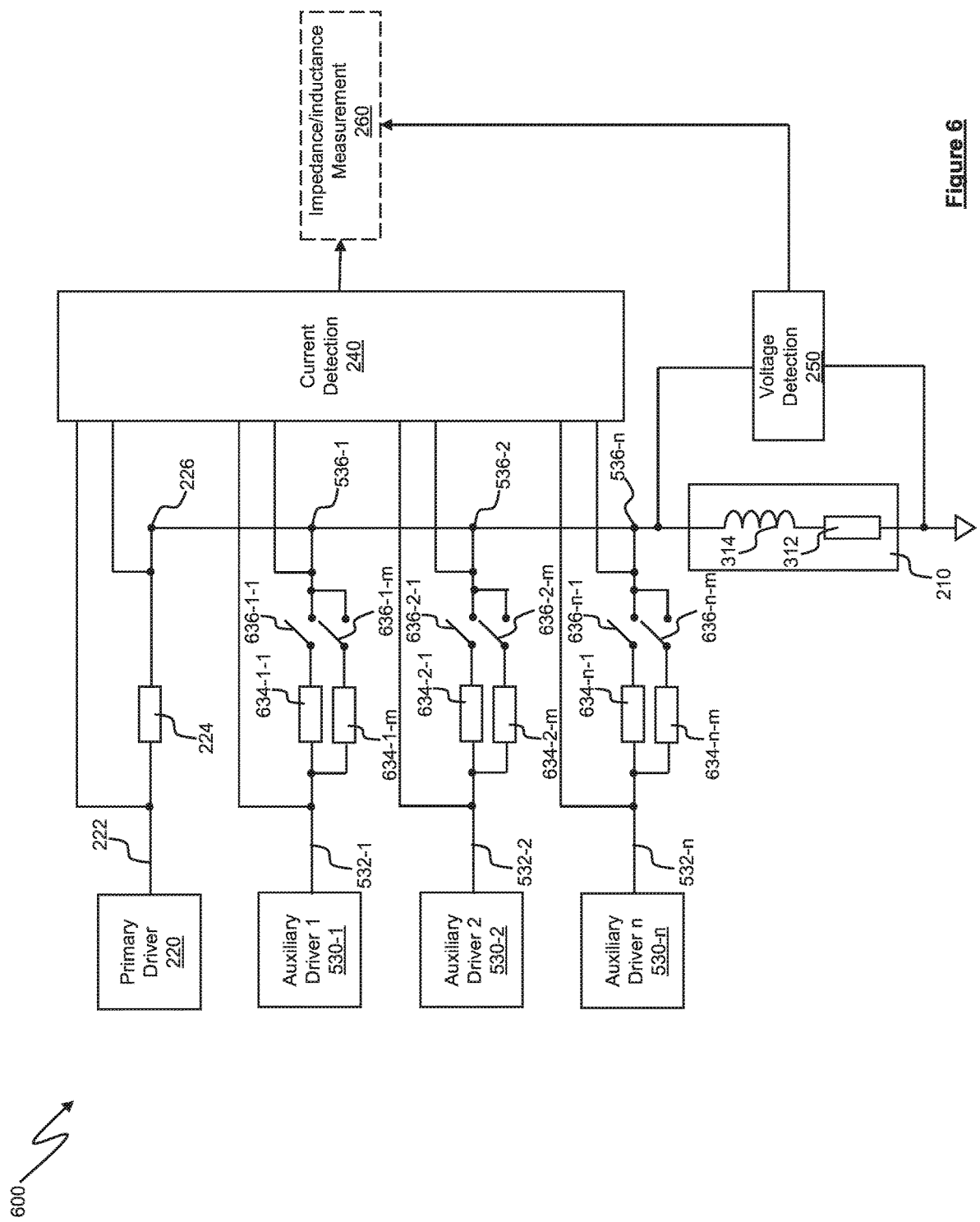
FIG. 6 is a schematic diagram illustrating another example of circuitry according to the present disclosure.

FIG. 6 is a schematic diagram illustrating another example of circuitry according to the present disclosure which can accommodate a range of load currents.

The circuitry, shown generally at 600 in FIG. 6, shares many elements in common with the circuitry 500 of FIG. 5. Such common elements are denoted by common reference numerals in FIGS. 5 and 6, and will not be described again here for the sake of clarity and brevity.

The circuitry 600 differs from the circuitry 500 of FIG. 5 in that each auxiliary signal path 532-1-532-*n* includes a plurality of selectable resistors, each having a different resistance, rather than a single auxiliary current sense resistor.

Thus, a first auxiliary signal path 532-1 includes a plurality of resistors 634-1-1-634-1-*m*, each connected in series with an associated selector switch 636-1-1-636-1-*m*. The resistors 634-1-1-634-1-*m* each have a different resistance.

Similarly, a second auxiliary signal path 532-2 includes a plurality of auxiliary current sense resistors 634-2-1-634-2-*m*, each having a different resistance and being connected in series with an associated selector switch 636-2-1-636-2-*m*, and an nth auxiliary signal path 532-*n* includes a plurality of auxiliary current sense resistors 634-*n*-1-634-*n*-*m*, each having a different resistance and being connected in series with an associated selector switch 636-*n*-1-636-*n*-*m*.

Thus, the circuitry 600 may be considered to be a hybrid of the circuitry 400 and the circuitry 500.

The circuitry 600, in its first mode of operation, operates in the same manner as the circuitry 200 described above, with all of the instances of auxiliary driver circuitry 530-1-530-*n* disabled or deactivated and the primary driver circuitry 220 enabled or activated to output the playback signal.

In the second mode of operation of the circuitry 600, the primary driver circuitry 220 is disabled or deactivated. One of the plurality of instances of auxiliary driver circuitry 530-1-530-*n* is enabled to output the pilot signal at a desired load current level, and one (or more) of the plurality of sense resistors in the auxiliary signal path associated with the active instance of auxiliary driver circuitry 530-1-530-*n* is selected, by closing the associated selector switch(es). The resistor(s) may be selected statically, e.g. based on the expected load current, and/or may be selected dynamically based on changes to the load current.

For example, if the first instance of auxiliary driver circuitry 530-1 is enabled, then a first one of the current sense resistors 634-1-1 may initially be selected, by closing the switch 636-1-1. In response to a change in the load current, e.g. in response to a change in the current output by the auxiliary driver circuitry 530-1, a different one of the current sense resistors 634-1-1-634-1-*m* may be selected.

While the pilot signal is being output by the selected instance of auxiliary driver circuitry 530-1-530-*n*, the current measurement circuitry 240 outputs a signal (e.g. a voltage) indicative of the current through the load 210, based on the voltage across the selected auxiliary current sense resistor of the auxiliary signal path associated with the selected instance of auxiliary driver circuitry 530-1-530-*n*.

In some examples, instances of auxiliary driver circuitry 530-1-530-*n* may be selected or enabled dynamically during operation of the circuitry 500 in its second mode, so as to vary the current applied to the load 210. The selectable resistors of the signal path associated with the selected auxiliary driver circuitry 530-1-530-*n* may then be dynamically selected as described above. Thus the circuitry 600 provides two different degrees of flexibility in enabling or switching an appropriate current sense resistor, based, for example, on the load current.

Because each instance of auxiliary driver circuitry 530-1-530-*n* is associated with a respective auxiliary signal path 532-1-532-*n* that contains a plurality of selectable auxiliary current sense resistors, the circuitry 600 can perform current sensing to a desired level of sensitivity for a range of load currents without clipping or saturation, and can accommodate a range of load current levels without adversely affecting the power consumption or efficiency of the primary signal path 222. Furthermore, as each of the selectable auxiliary current sense resistors is provided in a respective auxiliary signal path 532-1-532-*n*, rather than being part of the primary signal path 222, they do not introduce any distortion to the output of the load 210 when the circuitry 600 is operating in its first mode.

As in the previous examples, the primary driver circuitry 220 and the auxiliary driver circuitry 530-1-530-*n* shown in FIG. 6 may be implemented using any suitable circuitry. Where an instance of auxiliary driver circuitry 530-1-530-*n* is implemented using Class D amplifier circuitry, the associated auxiliary signal path 532-1-532-*n* may include an auxiliary signal path switch 354 of the kind described above with reference to FIG. 3, to prevent body diode conduction in the NMOS device of the respective instance of auxiliary driver circuitry.

In the examples described above, the primary and secondary driver circuitry are single-ended, and thus are configured to output signals whose amplitude varies over a range between a lower level (e.g. 0 v) and an upper level (e.g. 1.8 v). In order to accommodate the desired swing in output signal amplitude, the primary and secondary driver circuitry typically output a signal with a DC offset component. For example, the secondary driver circuitry may be configured to output a pilot signal in the form of a sinusoidal signal with a peak-to-peak amplitude of 1.8 v with a DC offset of 0.9 v, such that the instantaneous amplitude of the pilot signal is in the range 0 v-1.8 v.

When driving a signal with a DC offset (e.g. an offset sinusoid) in this way, all of the direct current (DC) must be sourced from the auxiliary driver circuitry, since the primary driver circuitry is disabled (e.g. in a high-impedance state) or deactivated (e.g. powered off).

Figure 7:
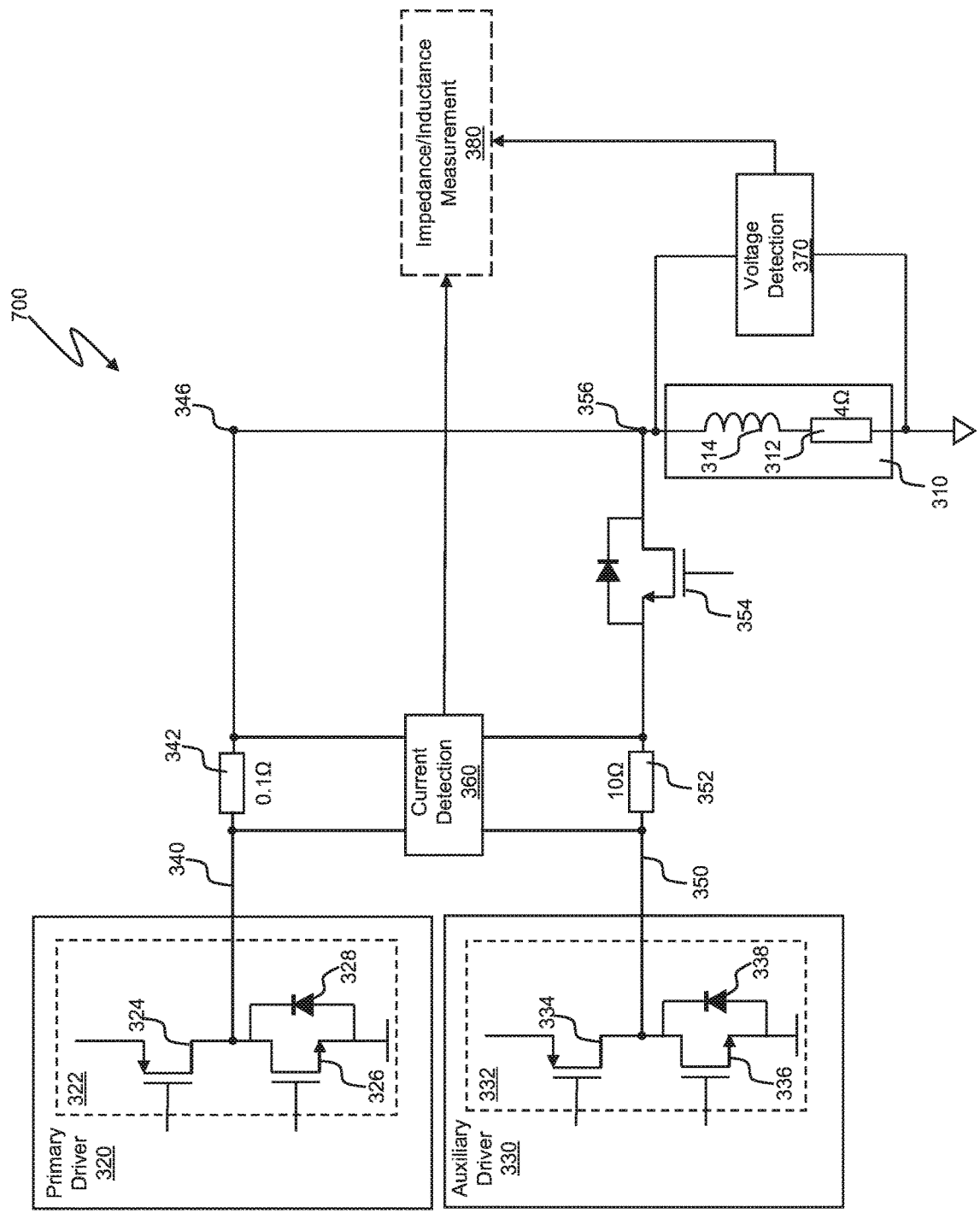
FIG. 7 shows circuitry similar to the circuitry of FIG. 3, with example resistance values for a primary current sense resistor and an auxiliary current sense resistor.

This DC current can "swamp" any large resistors used in the auxiliary signal path, as will now be discussed with reference to FIG. 7, which shows circuitry 700 which is similar to the circuitry 300 of FIG. 3. FIG. 7 also shows example resistance values for the primary current sense resistor 342 and the auxiliary current sense resistor 352.

For a load 310 having a resistance of 4Ω, in order to provide a DC offset component of 0.9 v the auxiliary driver circuitry 330 must supply a current of 225 mA. In the example shown in FIG. 7, in which the auxiliary current sense resistor has a resistance of 10Ω, this gives rise to a voltage drop of 2.25 v at the output node 356. A voltage of −2.25 v across the auxiliary current sense resistor 352 may saturate an analog front end (AFE) and/or an analog to digital converter (ADC) of the current detection circuitry 360.

This current "swamping" prevents accurate measurement of all load current by the current detection circuitry 360 based on the voltage across the auxiliary current sense resistor 352 during operation of the circuitry 700 in its second mode.

Additionally, the voltage of −2.25 v also appears at the output of the primary drive circuitry 320 which, if the primary drive circuitry 320 includes a Class D output stage 322 as shown in FIG. 7, will cause the body diode 328 of the PMOS device 326 to conduct.

Figure 8:
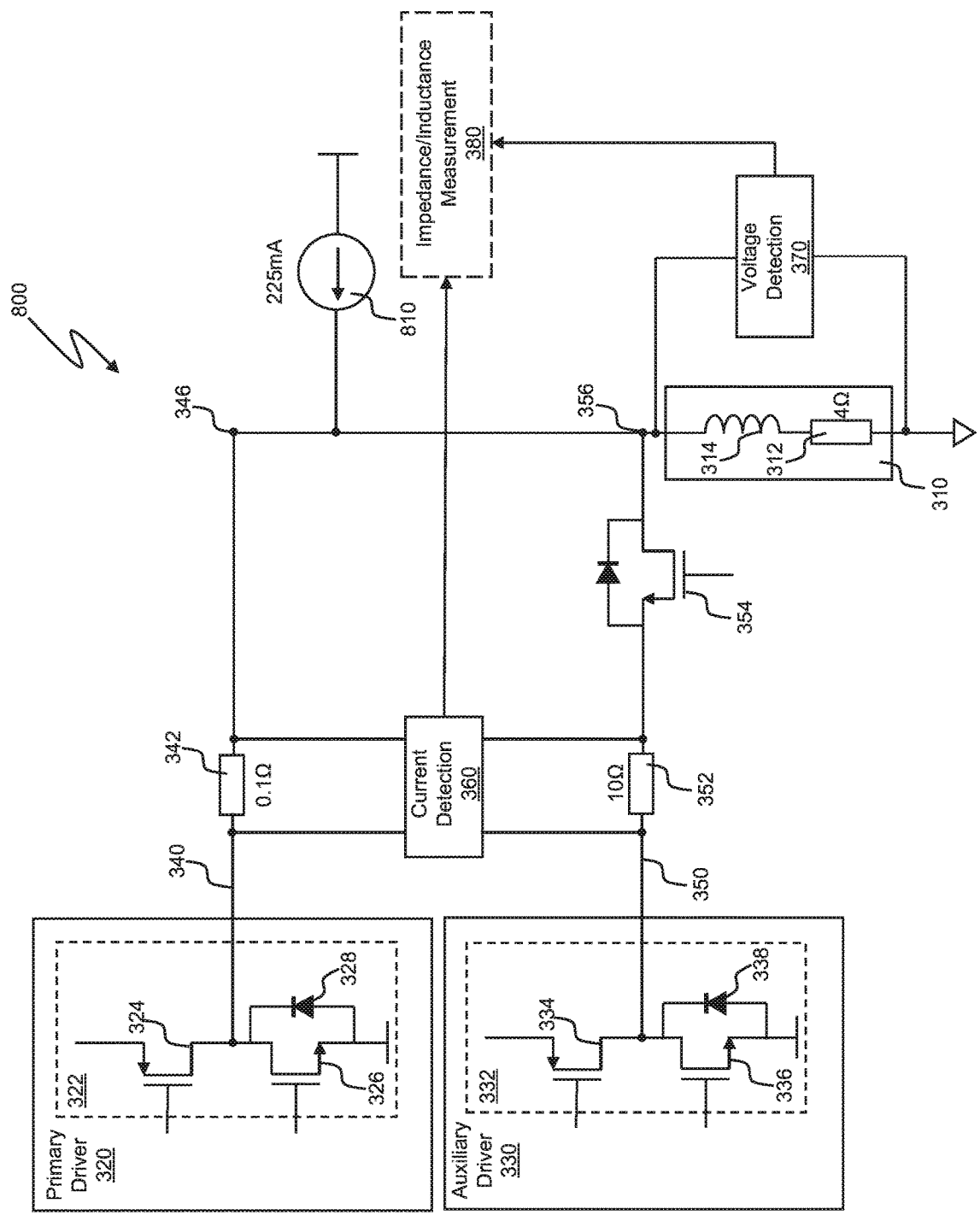
FIG. 8 is a schematic diagram illustrating example circuitry including additional driver circuitry that can mitigate, at least partially, current "swamping" in the circuitry of FIG. 7.

FIG. 8 is a schematic diagram illustrating example circuitry that can mitigate, at least partially, this current "swamping", so as to improve the accuracy of current measurement. The circuitry, shown generally at 800 in FIG. 8, shares a number of elements in common with the circuitry 300, 700 of FIGS. 3 and 7. Such common elements are denoted by common reference numerals and will not be described in detail here.

The circuitry 800 differs from the circuitry 700 in that it includes additional driver circuitry 810. An output of the additional driver circuitry 810 is coupled to the output node 356 of the auxiliary signal path 350. The additional driver circuitry 810 has a high output impedance and is configured to supply an additional DC current to the load 310 to support a DC offset in the pilot signal output by the auxiliary driver circuitry 330, during operation of the circuitry 800 in its second mode.

In the example illustrated in FIG. 8, the additional driver circuitry 810 comprises open-loop current digital to analog converter (DAC) circuitry configured to convert an input digital signal (e.g. a control word) representing a desired current level into an output current at the desired level.

In the example illustrated in FIG. 8 the additional driver circuitry 810 is configured to inject an additional current of 225 mA into the auxiliary signal path 350, in order to supply the current required to support a DC offset of 0.9 v in the pilot signal output to the load 310, which in this example has a resistance of 4Ω. Using the additional driver circuitry 810 to supply the additional current to the load 310 in this way prevents a voltage drop across the auxiliary current sense resistor 352, and thus prevents "swamping" of the auxiliary current sense resistor 352, enabling accurate measurement of the load current by the current detection circuitry 360, based on the voltage across the auxiliary current sense resistor 352 during operation of the circuitry 800 in its second mode.

In the example illustrated in FIG. 8 the additional driver circuitry 810 comprises open-loop current driver circuitry, but it is to be understood that the additional driver circuitry may be open-loop or closed loop, and may be either current driver circuitry or voltage driver circuitry. Where the additional driver circuitry is closed-loop, feedback may be provided to the additional driver circuitry on a continuous basis or a sampled basis in order to reduce the output DC current required from the additional driver circuitry.

Further, although in the example illustrated in FIG. 8 the additional driver circuitry 810 is configured to provide an output current of 225 mA, the output current or voltage provided by the additional driver circuitry may be variable. For example, where additional driver circuitry is provided in circuitry such as the circuitry 400, 500, 600 illustrated in FIGS. 4-6 in which the resistance of the auxiliary current sense resistor can be selected according to the load current, the output current or voltage provided by the additional driver circuitry may vary according to the resistance of the current sense resistor. Additionally or alternatively, the output current or voltage provided by the additional driver circuitry may vary according to an estimated transient response of the load 310 (which, as discussed above, may include restive and inductive components) to a DC voltage step output by the auxiliary driver circuitry 330.

Figure 9:
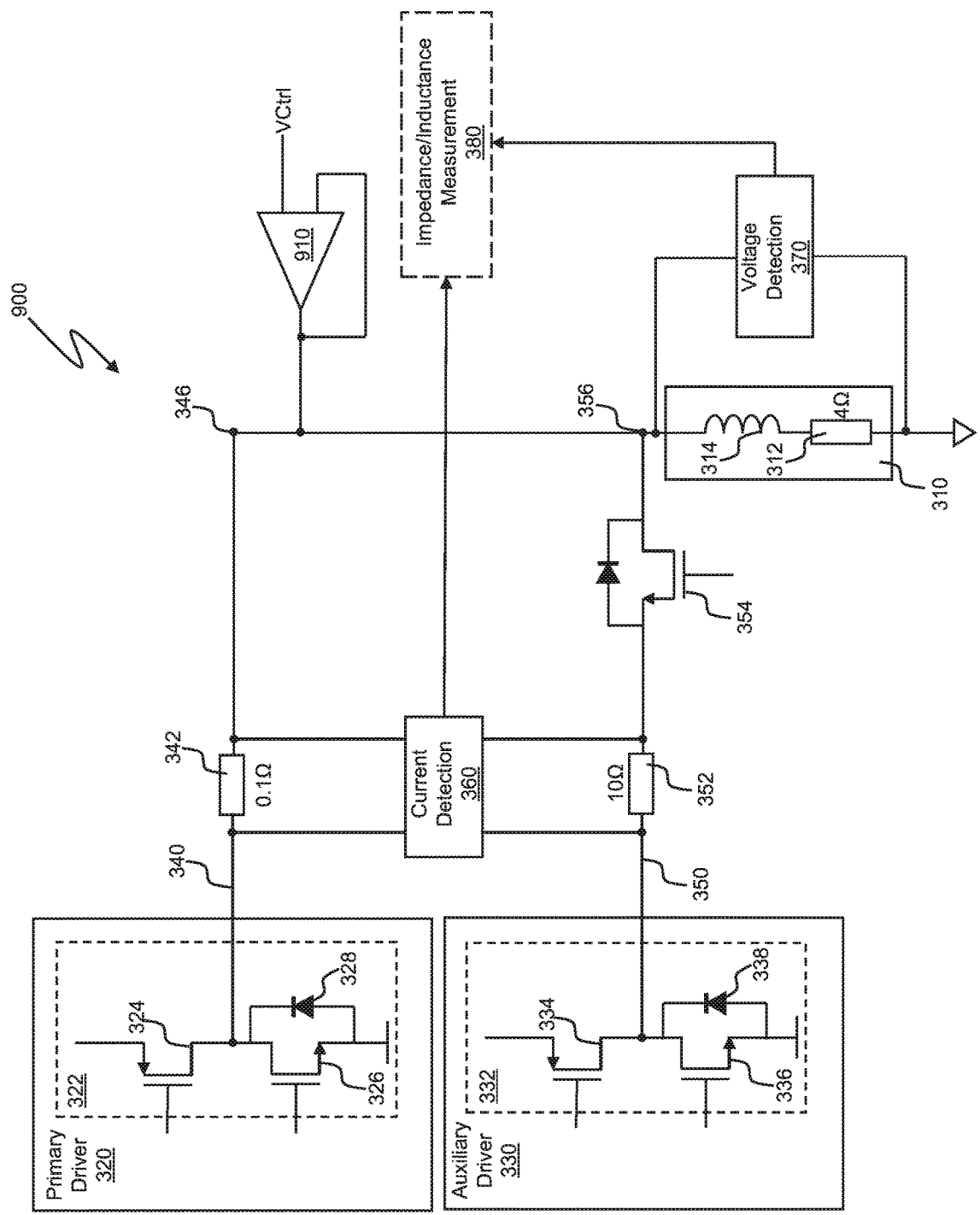
FIG. 9 is a schematic diagram illustrating example circuitry including additional driver circuitry.

FIG. 9 is a schematic diagram illustrating further example circuitry including additional driver circuitry. The circuitry, shown generally at 900 in FIG. 9, shares a number of elements in common with the circuitry 300, 700, 800 of FIGS. 3, 7 and 8. Such common elements are denoted by common reference numerals and will not be described in detail here.

In the circuitry 900 the additional driver circuitry is implemented as a closed-loop low bandwidth voltage driver, and comprises amplifier circuitry 910 having a first input which receives a control voltage Vctrl and a second input which is coupled to an output of the amplifier circuitry 910 to receive a feedback signal. The output of the amplifier circuitry 910 is coupled to output node 356 of the auxiliary signal path 350 so as to supply an additional voltage to the auxiliary signal path 350 to compensate for the voltage drop across the auxiliary current sense resistor 352.

In examples where multiple instances of auxiliary driver circuitry are provided, as in the circuitry 500, 600 shown in FIGS. 5 and 6, multiple instances of additional driver circuitry of the kind shown in FIG. 9, each having a different range and/or resolution, may be provided to compensate for a voltage drop across the auxiliary current sense resistors of each of the plurality of auxiliary signal paths.

Figure 10:
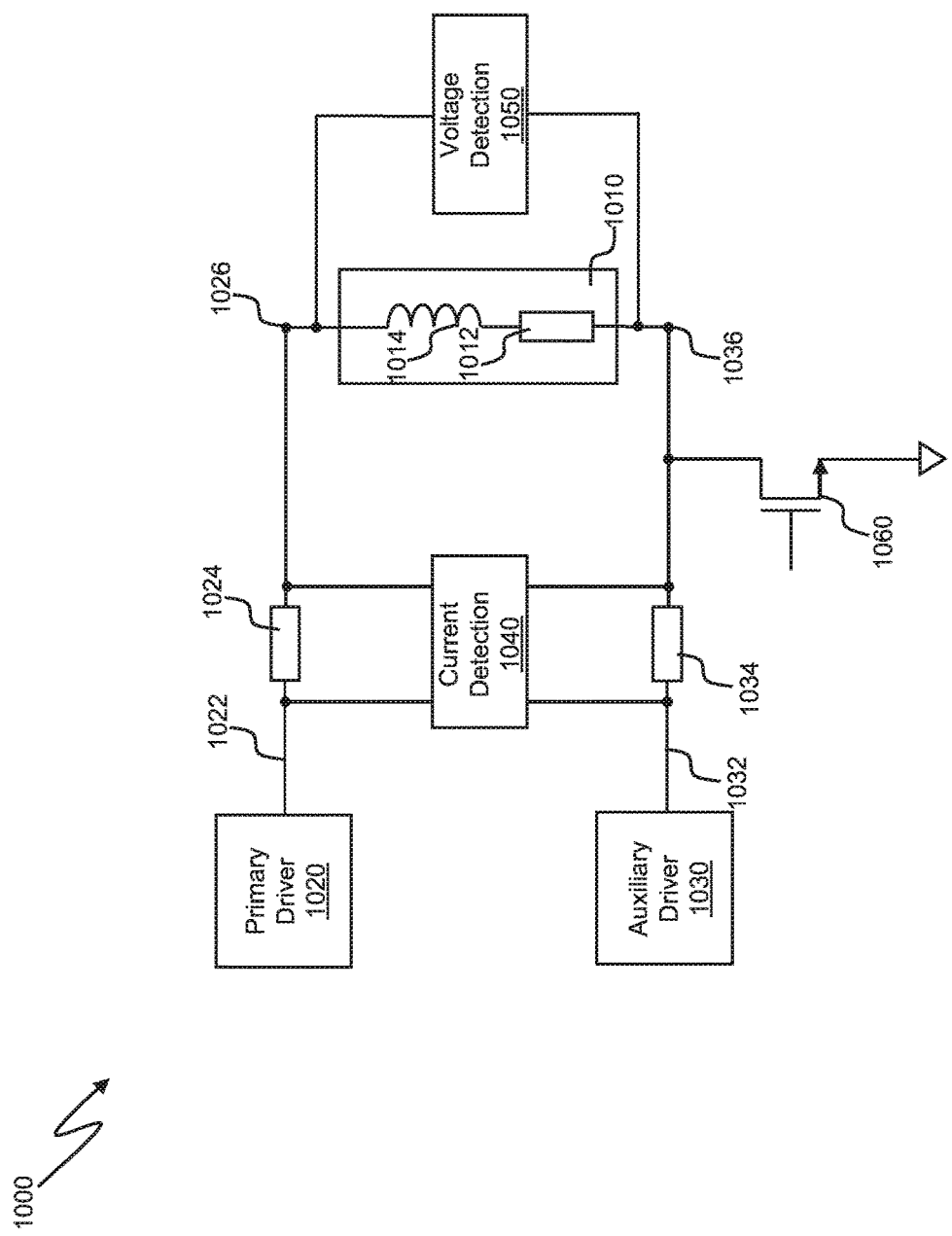
FIG. 10 is a schematic diagram illustrating further example circuitry according to the present disclosure.

FIG. 10 is a schematic diagram illustrating further example circuitry according to the present disclosure. The circuitry, shown generally at 1000 in FIG. 10, is configured to drive a load 1010, and includes primary driver circuitry 1020 and auxiliary driver circuitry 1030.

In the illustrated example the load 1010 is modelled as a series combination of a resistive component 1012 and an inductive component 1014, but it will be appreciated that the load 1010 may have other components (e.g. the load 1010 may have a capacitive component in addition to, or in place, of the resistive component or the inductive component) and that the load 1010 can be modelled as different configurations (e.g. series, parallel) of the components.

The primary driver circuitry 1020 is coupled to a primary signal path 1022 and is configured to output a playback signal at an output node 1026 of the primary signal path 1022 to drive the load 210 (when the load 210 is coupled to the circuitry). In the illustrated example the primary signal path 1022 includes a primary current sense resistor 224, but in other examples the primary current sense resistor 224 may be omitted.

The auxiliary driver circuitry 1030 is coupled to an auxiliary signal path 1032 and is configured to output a pilot signal at an output node 1036 of the auxiliary signal path 1032 to drive the load 1010 (when the load 1010 is coupled to the circuitry 1000). The auxiliary signal path 1032 includes an auxiliary current sense resistor 1034. The resistance of the auxiliary current sense resistor 1034 is significantly greater than the resistance of the primary current sense resistor 1024 (if provided). For example, if the resistance of the primary current sense resistor 1024 is 0.1Ω, the resistance of the auxiliary current sense resistor 1034 may be 10Ω. More generally, the resistance of the auxiliary current sense resistor 1034 may be of the order of 100 times the resistance of the primary current sense resistor 1024.

The circuitry 1000 further includes current detection circuitry 1040, having first and second inputs that are coupled to first and second terminals of the auxiliary current sense resistor 1034. If the circuitry 1000 includes a primary current sense resistor 1024, first and second terminals of the primary current sense resistor 1024 are coupled to third and fourth inputs of the current detection circuitry 1040.

The current sense circuitry 1040 is configured to generate a current sense signal (e.g. a voltage) indicative of a current through the load 1010 when the load 1010 is being driven by a pilot signal output by the auxiliary driver circuitry 1030. If the circuitry 1000 includes a primary current sense resistor 1024, the current sense circuitry 1040 is also configured to generate a current sense signal (e.g. a voltage) indicative of a current through the load 1010 when the load 1010 is being driven by a playback signal output by the primary driver circuitry 1020.

The circuitry 1000 further includes voltage detection circuitry 1050 which, in operation of the circuitry 1000, is coupled in parallel with the load 1010. The voltage detection circuitry 1050 is configured to generate a voltage sense signal indicative of a voltage across the load 1010 when the load 1010 is being driven by either a playback signal or a pilot signal.

The circuitry 1000 may also include impedance and/or inductance measurement circuitry (not shown in FIG. 10 for clarity), operative to receive the current sense signal and the voltage sense signal generated, respectively, by the current detection circuitry 1040 and the voltage detection circuitry 1050 and to calculate, estimate or otherwise determine an impedance and/or an inductance of the load 1010 based on the received current sense and voltage sense signals.

In contrast to the examples discussed above and shown in FIGS. 2-9, in which a first terminal of the load is coupled, in use, to an output node of the primary signal path and a second terminal of the load is coupled, in use, to ground or some other reference voltage supply, in use of the circuitry 1000 a first terminal of the load 1010 is coupled to the output node 1026 of the primary signal path 1022 and a second terminal of the load 1010 is coupled to the output node 1036 of the auxiliary signal path 1032. Thus in use of the circuitry 1000 the load 1010 is treated as a pseudo-differential load.

The circuitry further includes a switch 1060 coupled between the auxiliary signal path 1032 and ground (or some other reference voltage supply).

In operation of the circuitry 1000 in a first, normal, mode of operation, the auxiliary driver circuitry 1030 is disabled or deactivated (e.g. by setting the auxiliary signal path 1032 to a high impedance state or by decoupling the auxiliary driver circuitry 1030 from a power supply), such in the first mode of operation the auxiliary driver circuitry 1030 is inoperative and does not output the pilot signal to the load 1010. The primary driver circuitry 1020 is enabled or activated and the switch 1060 is switched on, to couple the second terminal of the load 1010 to ground (or some other reference voltage supply).

The primary driver circuitry 1020 outputs a playback signal to the load 1010, via the primary signal path 1022, to cause the load 1010 to generate a desired output, which may be, for example, an audio output if the load 1010 is an audio transducer such as a speaker or a haptic output if the load 1010 is a haptic transducer such as a linear resonant actuator.

If the primary current sense resistor 1024 is provided, the current detection circuitry 1040 may output a current sense signal indicative of the current through the load 1010, based on the voltage across the primary current sense resistor 1024, while the playback signal is being output to the load 1010 by the primary driver circuitry 1020. The voltage detection circuitry 1050 may also output a voltage sense signal indicative of the voltage across the load 1010 while the playback signal is being output to the load 1010 by the primary driver circuitry 1020, and these signals may be used by the impedance and/or inductance measurement circuitry (if provided) to determine an impedance and/or an inductance of the load 1010 when driven by the playback signal.

In operation of the circuitry 1000 in a second, auxiliary measurement, mode of operation, the primary driver circuitry 1020 is disabled or deactivated (e.g. by setting the primary signal path 1022 to a high-impedance state or by decoupling the primary driver circuitry 1020 from a power supply) such that in the second mode of operation the primary driver circuitry 1020 is inoperative and does not output the playback signal to the load 1010. The auxiliary driver circuitry 1030 is enabled or activated, and the switch 1060 is opened. The auxiliary driver circuitry 1030 outputs the pilot signal to the load, via the auxiliary current sense resistor 1034. A loop of the primary driver circuitry 1020 is closed to provide 0 v DC across the load 1010, such that during operation in the second mode, only AC current flows through the load and therefore through the auxiliary current sense resistor 1034.

The current detection circuitry 1040 outputs a current sense signal indicative of the current through the load 1010, based on the voltage across the auxiliary current sense resistor 1034 while the pilot signal is being output to the load 1010 by the auxiliary driver circuitry 1030. The voltage detection circuitry 1050 may also output a voltage sense signal indicative of the voltage across the load 1010 while the pilot signal is being output to the load 1010 by the auxiliary driver circuitry 1030, and these signals may be used by the impedance and/or inductance measurement circuitry (if provided) to determine an impedance and/or an inductance of the load 1010 when driven by the pilot signal. The determined impedance may be used by downstream processing circuitry (not shown) for a variety of applications. For example, where the load is an LRA, the determined impedance may be used by the downstream circuitry to determine or estimate the position (or a magnitude of a change in the position) of a mass of an LRA.

The pseudo-differential arrangement of the circuitry 1000 of FIG. 10 removes the need for the pilot signal output by the auxiliary driver circuitry to contain a DC offset, and thus removes the large DC current required by the examples illustrated in FIGS. 2-9 when operating in the second mode. However, the switch 1060 introduces an additional resistance to the primary signal path 1022, and thus the power consumption of the circuitry 1000 is increased, and its efficiency is reduced, in comparison to the examples shown in FIGS. 2-9, when operating in its first mode.

Figure 11:
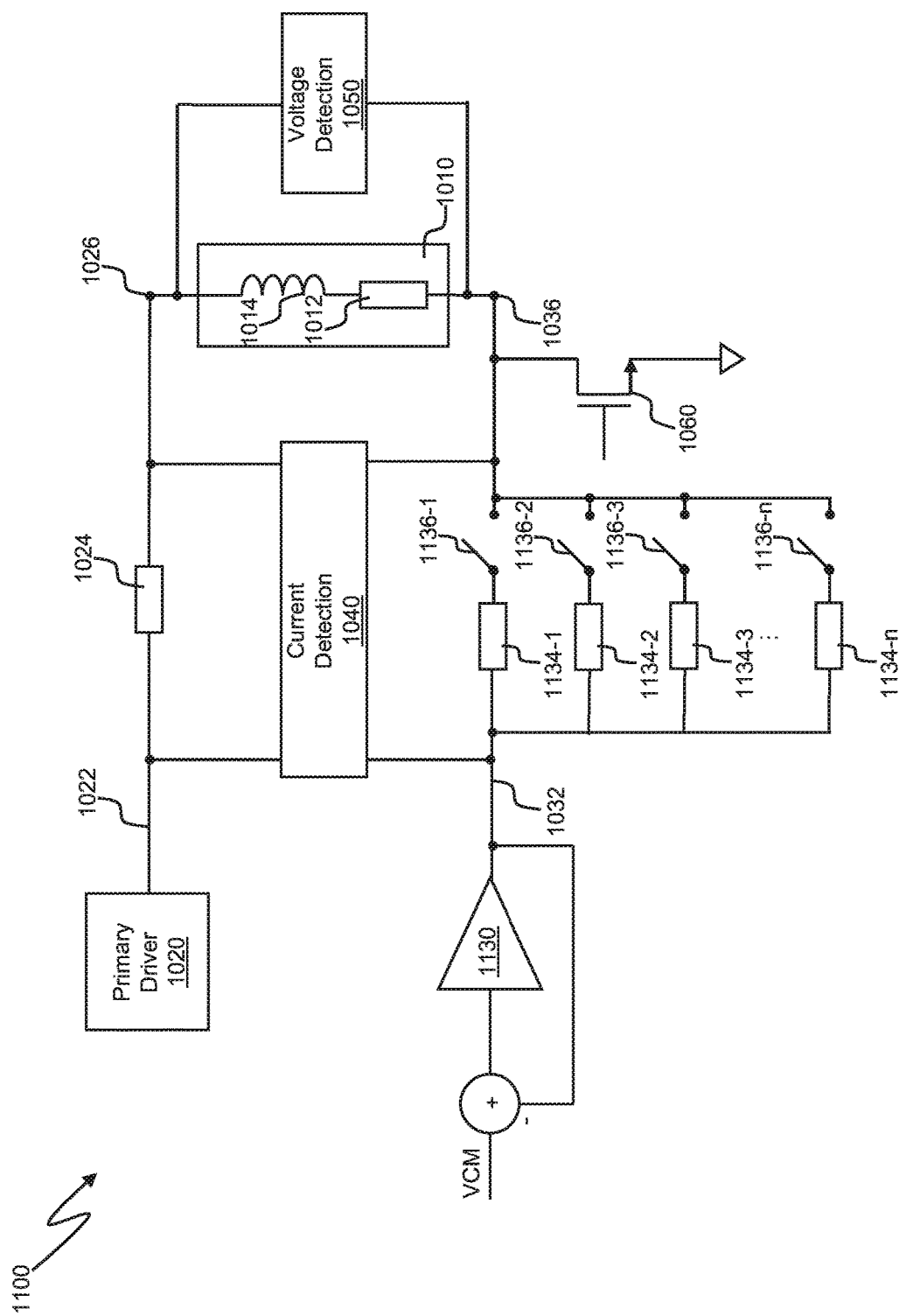
FIG. 11 is a schematic diagram illustrating further example circuitry according to the present disclosure.

FIG. 11 is a schematic diagram illustrating further example circuitry according to the present disclosure. The circuitry, shown generally at 1100 in FIG. 11, shares a number of elements in common with the circuitry 1000 of FIG. 10. Such common elements are denoted by common reference numerals and will not be described in detail here.

In the example of FIG. 11, auxiliary circuitry 1130 having a low output impedance (which in the illustrated example takes the form of closed loop amplifier circuitry) is coupled to the auxiliary signal path 1032. Instead of a single auxiliary current sense resistor 1034, as in the circuitry 100 of FIG. 10, the auxiliary signal path 1032 includes a plurality of selectable resistors 1134-1-1134-n, each having a different resistance and being coupled in series with an associated selector switch 1136-1-1136-n.

Thus, a first terminal of a first resistor 1134-1 is coupled to the output of the auxiliary driver circuitry 1130 and to the first input of the current detection circuitry 1040. A second terminal of the first resistor 1134-1 is coupled to a first terminal of a first selector switch 1136-1. A second terminal of the first selector switch 1136-1 is coupled to the second input of the current detection circuitry 1040, and to the load 1010 (when the load 1010 is coupled to the circuitry 1100).

Each of the other resistors 1134-2-1134-n and their associated selector switches 1136-2-1136-n is connected in parallel with the first resistor 1134-1 and its associated selector switch 1136-1.

Thus, by closing one (or more) of the plurality of selector switches 1136-1-1136-n, one (or more) of the resistors 1134-1-1134-n can be coupled to the output of the auxiliary driver circuitry 1130 and to the current detection circuitry 1040, for use as the auxiliary current sense resistor in operation of the circuitry 1100 in its second mode. In this way the resistance used for current sensing in the second mode of operation of the circuitry 1100 can be adjusted, e.g. according to the current applied to the load 1010.

The circuitry 1100, in its first mode, operates in the same manner as the circuitry 1000 described above.

In one implementation, the auxiliary driver circuitry 1130 outputs a constant DC voltage to the output node 1036 of the auxiliary signal path 1032 during operation of the circuitry 1100 in its second mode, so as to maintain the output node 1036 at the constant DC voltage, and the primary driver circuitry 1020 outputs the pilot signal at the output node 1026 of the primary signal path 1022 to drive the load 1010 (when the load 1010 is coupled to the circuitry 1100).

In an alternative implementation, the primary driver circuitry 1020 outputs a constant DC voltage to the output node 1026 of the primary signal path 1022 during operation of the circuitry 1100 in its second mode, so as to maintain the output node 1026 at the constant DC voltage, and the auxiliary driver circuitry 1130 outputs a pilot signal at the output node 1036 of the auxiliary signal path 1032 to drive the load 1010 (when the load 1010 is coupled to the circuitry 1100).

By providing a constant DC voltage to the output node of the signal path which does not receive the pilot signal (i.e. the output node 1026 when the pilot signal is provided by the auxiliary driver circuitry 1130, or the output node 1036 when the pilot signal is provided by the primary driver circuitry 1020), a flow of DC current through the load can be prevented, which reduces the settling time of the circuitry 1100, particularly where the load has an inductive component, thus reducing the time required to obtain a load current measurement and improving the power efficiency of the circuitry 1100 when operating in its second mode.

In both implementations, one (or more) of the plurality of resistors 1134-1-1134-$n$ is selected for use as the auxiliary current sense resistor, by switching on the relevant selector switch(es) 1134-1-1134-$n$ with a suitable control signal. The resistor(s) 1134-1-1134-$n$ for use as the auxiliary current sense resistor may be selected statically in advance of operation of the circuitry 1100 in its second mode, e.g. according to the current to be applied to the load. Alternatively, the resistor(s) 1134-1-1134-$n$ may be selected dynamically during operation of the circuitry 1100 in the second mode, e.g. according to the load current, such that different ones of the resistors 1134-1-1134-$n$ are selected as the load current changes. For example, when the load current is within a first current range the first resistor 1134-1 may be selected, by closing the associated selector switch 1136-1. If the load current increases to a level within a second current range, the first current sense resistor 1134-1 may be deselected by opening the selector switch 1136-1, and a second current sense resistor 1134-2, of lower resistance than the first current sense resistor 1134-1, may be selected by, closing its associated selector switch 1136-2.

As will be appreciated from the foregoing discussion, providing a plurality of selectable resistors of different resistances that can be statically or dynamically selected to be coupled into the auxiliary signal path permits the optimal current sense resistance to be used for a given current applied to the load, which facilitates current sensing to a desired sensitivity without significantly adversely affecting the power consumption or efficiency of the circuitry 1100 when it operates in the first mode. Furthermore, because the resistors 1134-1-1134-$n$ and their associated selector switches 1136-1-1136-$n$ are provided in the auxiliary signal path, they do not introduce any distortion to the output of the load 1010 when the circuitry 1100 operates in its first mode.

However, the selector switches 1136-1-1136-$n$ in the auxiliary signal path 1032 of the circuitry 1100 each have an impedance (even when switched on) and parasitic elements (e.g. a parasitic resistance, and/or inductance and/or capacitance) which may have a negative effect on the accuracy of load current measurements in operation of the circuitry 1100 in its second mode. Additionally, the selector switches 1136-1-1136-$n$ will degrade the temperature drift accuracy of the circuitry 1100, as the temperature coefficient of the resistors 1134-1-1134-$n$ is much lower than that of their associated selector switches 1136-1-1136-$n$, particularly if the resistors 1134-1-1134-$n$ are implemented using tantalum nitride resistors. Further, modulation of the impedance of the selector switches 1136-1-1136-$n$ can cause non-linearity. Thus it may be desirable to provide a plurality of selectable resistors for use as the auxiliary current sense resistor without having any switches in the auxiliary signal path 1032.

Figure 12:
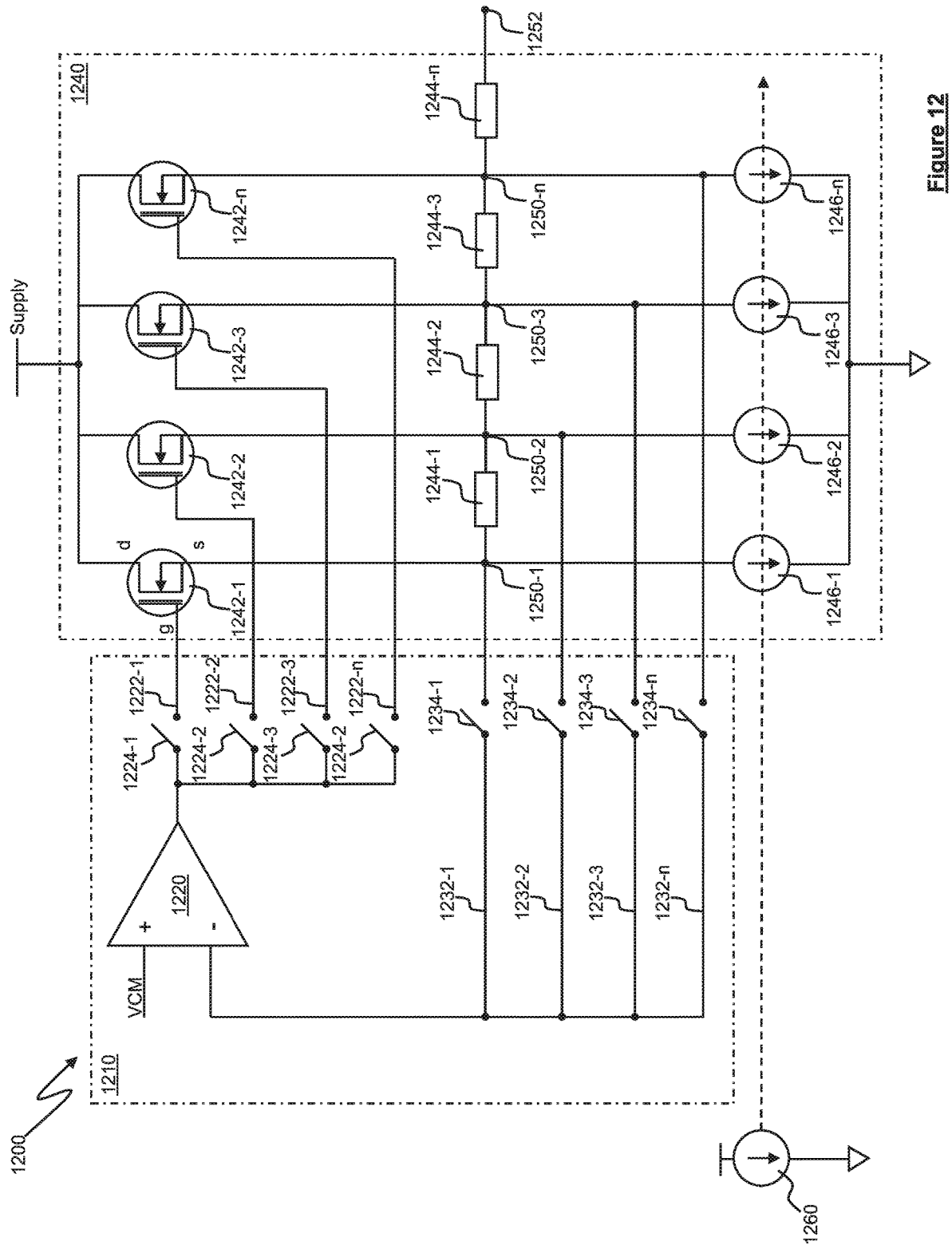
FIG. 12 is a schematic diagram showing example voltage driver circuitry for use as auxiliary driver circuitry in the circuitry of FIG. 10.

FIG. 12 is a schematic diagram showing example voltage driver circuitry for use as the auxiliary driver circuitry 1030 in the circuitry 1000 of FIG. 10, which provides a plurality of selectable resistances without requiring any switches in the auxiliary signal path.

The voltage driver circuitry, shown generally at 1200 in FIG. 12, comprises an input stage 1210 and an output stage 1240.

The input stage 1210 in this example comprises amplifier circuitry 1220 having a non-inverting (+) input for receiving constant DC voltage VCM, an inverting input (−) for receiving a feedback signal, and an output for outputting an output signal.

Inputs of a plurality of auxiliary signal paths 1222-1-1222-$n$ are coupled to the output of the amplifier circuitry 1220. Each auxiliary path 1222-1-1222-$n$ includes a respective auxiliary path selector switch 1224-1-1224-$n$.

Outputs of a plurality of feedback paths 1232-1-1232-$n$ are coupled to the inverting input of the amplifier circuitry 1220. Each feedback path 1232-1-1232-$n$ includes a respective feedback path selector switch 1234-1-1234-$n$.

The output stage 1240 in this example comprises a plurality of selectable output stage segments, each of which comprises an output device 1242-1-1242-$n$ and a resistor 1244-1-1244-$n$ coupled to an output node of its respective selectable output stage segment. Each output device is configured to control a voltage at an output terminal of the output device based on an input signal received from the input stage 1210 at a control terminal of the output device.

The output devices may comprise MOSFET devices 1242-1-1242-$n$ (which in the illustrated example are depletion mode NMOS devices, but which could, in alternative implementations, be enhancement mode NMOS devices or enhancement or depletion mode PMOS devices).

The resistors 1244-1-1244-$n$ are connected in series to form a resistor string, and the output stage 1240 further comprises a plurality of current sinks 1244-1-1244-$n$.

In the illustrated example, a drain terminal of each of the MOSFET devices 1242-1-1242-$n$ is coupled to a positive supply voltage rail of the circuitry 1200.

A gate terminal of each of the MOSFET devices 1242-1-1242-$n$ is coupled to an output of a respective one of the auxiliary signal paths 1222-1-1222-$n$. Thus, for example, a gate terminal of a first MOSFET device 1222-1 is coupled to the output of a first auxiliary signal path 1222-1, a gate terminal of a second MOSFET device 1222-2 is coupled to the output of a second auxiliary signal path 1222-2, etc. Thus, the gate terminal of each of the MOSFET devices 1242-1-1242-$n$ (which, as will be appreciated by those skilled in the art, is a control terminal of the output device) can receive a signal output by the input stage 1210 as an input signal.

Each of the plurality of current sinks 1246-1-1246-$n$ is coupled between a source terminal of a respective one of the MOSFET devices 1242-1-1242-*n* and ground (or some other reference voltage supply). Thus, for example, a source terminal of the first MOSFET device 1242-1 is coupled to a first one of the plurality of current sinks 1246-1, a source terminal of the second MOSFET device 1242-2 is coupled to a second one of the plurality of current sinks 1246-2, etc.

The plurality of resistors 1244-1-1244-*n* of the resistor string are coupled in series between a first resistor string node 1250-1 of a plurality of resistor string nodes 1250-1-1250-*n* and a resistor string output node 1252. In use of the voltage driver circuitry 1200, the resistor string output node 1252 is coupled to the second terminal of the load 1010.

Each of the plurality of resistor string nodes 1250-1-1250-*n* is coupled to an input of a respective one of the feedback paths 1232-1-1232-*n*. Thus, for example, the first resistor string node 1250-1 is coupled to the input of a first feedback signal path 1232-1, the second resistor string node 1250-2 is coupled to the input of a second feedback signal path 1232-2, etc.

Each of the plurality of resistor string nodes 1250-1-1250-*n* is also coupled to a first terminal of a respective one of the plurality of auxiliary current sense resistors 1244-1-1244-*n*. Thus, for example, the first resistor string node 1250-1 is coupled to a first terminal of a first auxiliary current sense resistor 1244-1, the second resistor string node 1250-2 is coupled to a first terminal of a second resistor 1244-2, etc.

Each of the plurality of resistor string nodes 1250-1-1250-*n* is also coupled to the source terminal of a respective one of the MOSFET devices 1242-1-1242-*n* so as to provide an output node for the selectable output stage segment to which the respective MOSFET device belongs.

Thus, each of the plurality of resistor string nodes 1250-1-1250-*n* connects the source terminal of a respective one of the plurality of MOSFET devices 1242-1-1242-*n* to: the input of a respective one of the feedback paths 1232-1-1232-*n*; the first terminal of a respective one of the plurality of resistors 1244-1-1244-*n*; and a respective one of the plurality of current sinks 1246-1-1246-*n*.

The voltage driver circuitry 1200 further includes current sink circuitry 1260.

In operation of the voltage driver circuitry 1200 (i.e. for performing current measurements in the second mode of operation of the circuitry 1000), one of the plurality of auxiliary signal paths 1222-1-1222-*n* is selected or enabled by closing its respective auxiliary path selector switch 1224-1-1224-*n*, to couple the output of the amplifier circuitry 1220 to the gate terminal of the associated one of the MOSFET devices 1242-1-1242-*n*, thus selecting the output stage segment to which that MOSFET device belongs. The other auxiliary signal paths are deselected or disabled, by opening their respective auxiliary path selector switches, thus deselecting the other output stage segments.

A feedback path 1232-1-1232-*n* corresponding to the selected auxiliary signal path is also selected or enabled, by closing its respective feedback selector switch 1234-1-1234-*n*, to couple the source terminal of the associated one of the MOSFET devices 1242-1-1242-*n* to the inverting input of the amplifier circuitry 1220, to permit regulation of a voltage at the resistor string node 1250-1-1250-*n* to which the source terminal of the selected MOSFET device 1242-1-1242-*n* is coupled in order to maintain a constant DC voltage VCM at that resistor string node. The other feedback paths are deselected or disabled by opening their respective feedback path switches.

For example, to select or enable a first output stage segment (comprising the first MOSFET device 1242-1), the first current sink 1246-1 and the first resistor 1244-1, the first auxiliary path selector switch 1224-1 is closed, thus coupling the output of the amplifier circuitry 1220 to the gate terminal of the first MOSFET device 1242-1. The auxiliary path selector switches 1224-2-1224-*n* are opened, to deselect or disable the other auxiliary signal paths 1222-2-1222-*n*. The first feedback path 1232-1 is also selected or enabled, by closing its feedback selector switch 1234-1, thus coupling the source terminal of the first MOSFET device 1242-1 to the non-inverting input of the amplifier circuitry 1220. The resulting feedback loop permits regulation of a voltage at the first resistor string node 1250-1, to maintain a constant voltage VCM at the first resistor string node 1250-1.

Thus, in use of the circuitry 1200, a constant voltage VCM is provided at the resistor string node 1250-1-1250-*n* associated with the selected output stage segment, and the resistor belonging to the selected output stage segment is included in a series combination of resistors that acts as the effective auxiliary current sense resistor.

The number of resistors 1244-1-1244-*n* that are included in the series combination that acts as the effective auxiliary current sense resistor is dependent upon which of the plurality of output stage segments is selected. Thus, if the first output stage segment is selected, the constant voltage VCM develops at the first resistor string node 1250-1 and so the effective auxiliary current sense resistor includes the first to nth resistors 1244-1-1244-*n*, whereas if the nth output stage segment is selected, the constant voltage VCM develops as the nth resistor string node 1250-*n*, such that the effective auxiliary current sense resistor includes only the nth resistor 1244-*n*.

As will be apparent, the more of the plurality of resistors 1244-1-1244-*n* that are included, the greater the resistance of the effective auxiliary current sense resistor. Thus, a desired resistance for the effective auxiliary current sense resistor can be achieved by selecting an appropriate one of the plurality of output stage segments.

Thus the circuitry 1200 permits a desired resistance for the auxiliary current sense resistance to be selected, without requiring any switches in the auxiliary signal path, and thus does not adversely affect the accuracy of current measurements. However, because the driver stage includes a plurality of MOSFET devices 1242-1-1242-*n* and a corresponding plurality of current sinks 1246-1-1246-*n*, it occupies a larger area than the circuitry 1000 of FIG. 10 or the circuitry 1100 of FIG. 11.

Figure 13:
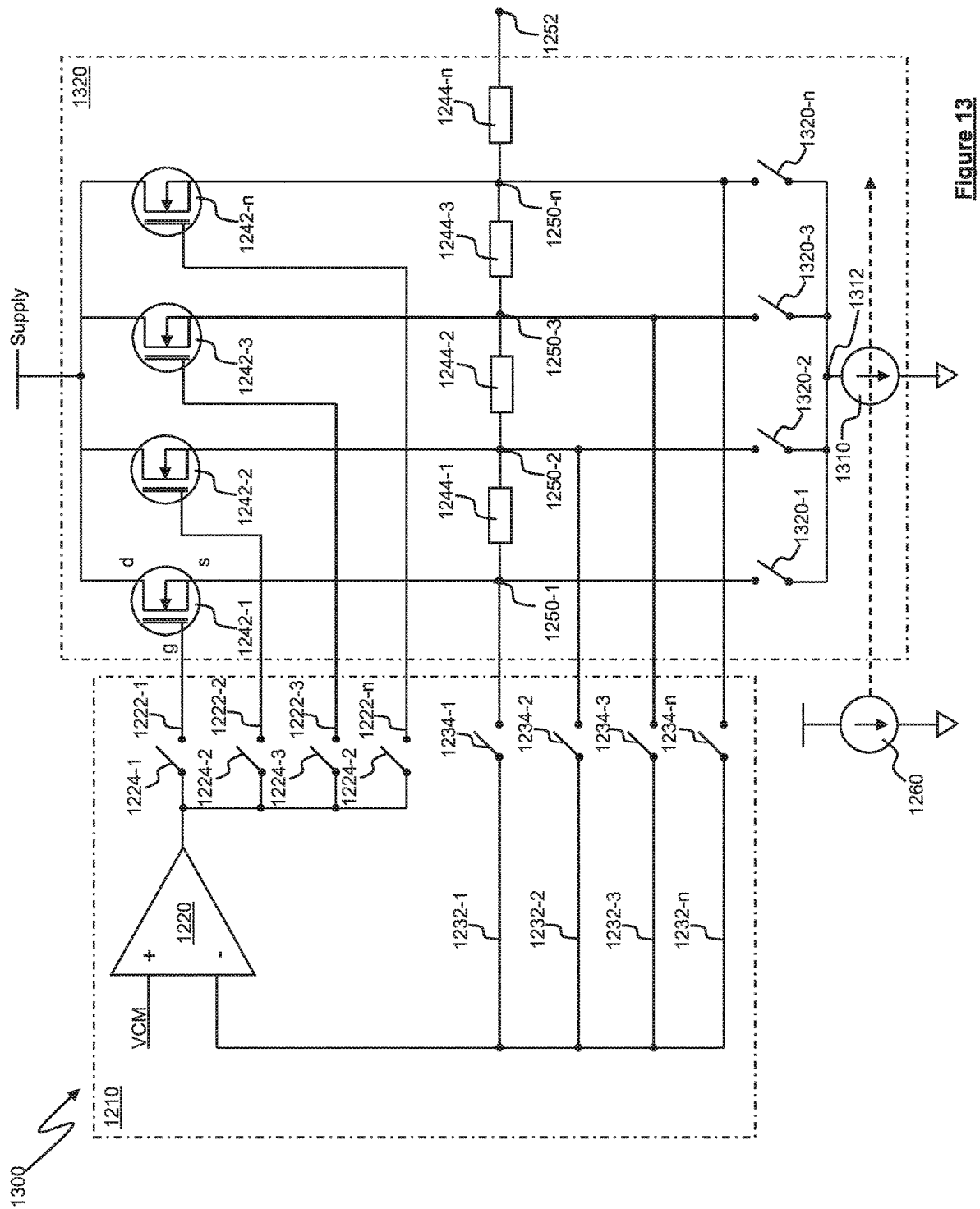
FIG. 13 is a schematic diagram showing alternative example voltage driver circuitry for use as the auxiliary driver circuitry in the circuitry of FIG. 10.

FIG. 13 is a schematic diagram showing alternative example voltage driver circuitry for use as the auxiliary driver circuitry 1030 in the circuitry 1000 of FIG. 10, which provides a plurality of selectable resistances without requiring any switches in the auxiliary signal path. The circuitry, shown generally at 1300 in FIG. 13, shares a number of elements in common with the circuitry 1200 of FIG. 12. Such common elements are denoted by common reference numerals and will not be described in detail here.

The circuitry 1300 comprises an input stage 1210 and an output stage 1320, and differs from the circuitry 1200 in that the plurality of current sinks 1246-1-1246-*n* are replaced by a single current sink 1310 and a plurality of current sink path selector switches 1320-1-1320-*n*.

The current sink 1310 is coupled between a shared current sink node 1312 and ground (or some other reference voltage supply). Each of the current sink path selector switches 1320-1-1320-*n* is coupled between a respective one of the plurality of resistor string nodes 1250-1-1250-*n* and the shared current sink node 1312. For example, a first current sink path selector switch 1320-1 is coupled between the first resistor string node 1250-1 and the shared current sink node 1312, a second current sink path selector switch 1320-2 is coupled between the second resistor string node 1250-2 and the shared current sink node 1312, etc. Thus, each of the current sink path selector switches 1320-1-1320-*n* enables the source terminal of a respective one of the MOSFET devices 1242-1-1242-*n* to be connected to the current sink 1310.

The circuitry 1300 operates in substantially the same manner as the circuitry 1200 described above, with the exception that, as well as selecting an auxiliary current path 1222-1-1222-*n* and its corresponding feedback path, the relevant one of the MOSFET devices 1242-1-1242-*n* is also coupled to the current sink 1310 by closing the relevant one of the current sink path selector switches 1320-1-1320-*n*. For example, if the first auxiliary signal path 1222-1 is selected, then the first feedback path 1232-1 is also selected and a first current sink path selector switch 1320-1 is closed to couple the current sink 1310 to the first MOSFET device 1242-1. If the second auxiliary signal path 1222-2 is selected, then the second feedback path 1232-2 is also selected and a second current sink path selector switch 1320-2 is closed to couple the current sink 1310 to the second MOSFET device 1242-2.

By using a single current sink 1310 that can be selectively coupled to the MOSFET devices 1242-1-1242-*n* in this way, the total area of the circuitry 1300 is reduced, in comparison with the circuitry 1200 of FIG. 12. Like the circuitry 1200, the circuitry 1300 does not include any switches in the auxiliary signal path, and thus does not adversely affect the accuracy of current measurements.

Figure 14:
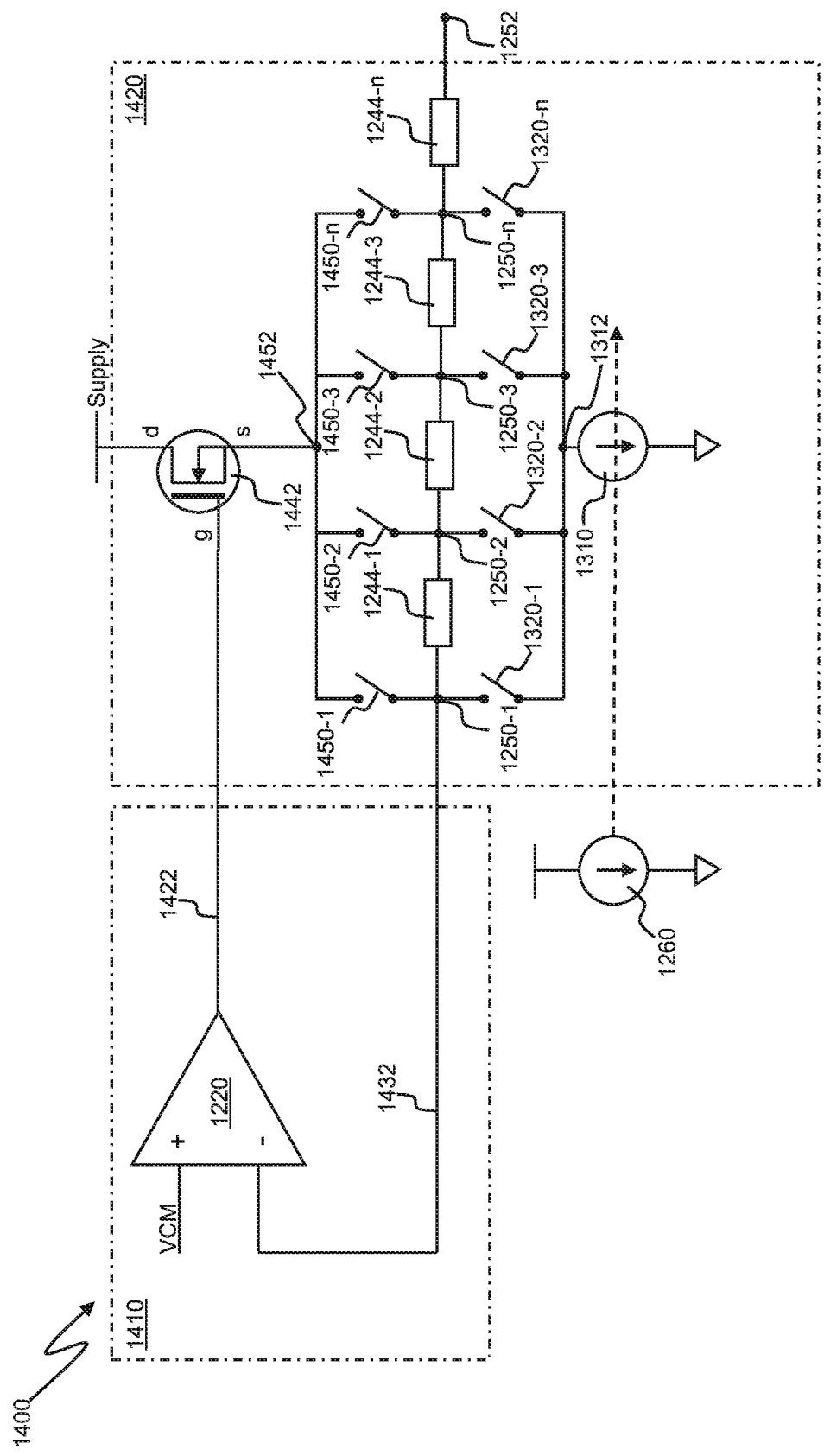
FIG. 14 is a schematic diagram showing further alternative example voltage driver circuitry for use as the auxiliary driver circuitry in the circuitry of FIG. 10.

FIG. 14 is a schematic diagram showing alternative example voltage driver circuitry for use as the auxiliary driver circuitry 1030 in the circuitry 1000 of FIG. 10, which provides a plurality of selectable resistances without requiring any switches in the auxiliary signal path. The circuitry, shown generally at 1400 in FIG. 14, shares a number of elements in common with the circuitry 1300 of FIG. 13. Such common elements are denoted by common reference numerals and will not be described in detail here.

The circuitry 1300 comprises an input stage 1410 and an output stage 1420, and differs from the circuitry 1300 in that the input stage 1410 includes only a single auxiliary signal path 1422, instead of a plurality of selectable auxiliary signal paths, and in that the output stage includes only a single MOSFET device 1442, instead of a plurality of MOSFET devices. The output stage 1420 further includes a plurality of NMOS source path selector switches 1450-1-1450-*n* which are each coupled between a respective one of the plurality of resistor string nodes 1250-1-1250-*n* and a shared MOSFET source node 1452, which is coupled to the source terminal of the MOSFET device 1442.

In operation of the circuitry 1400, a desired series combination comprising some or all of the resistors 1244-1-1244-*n* is selected for use as the auxiliary current sense resistor, by closing one of the MOSFET source path switches 1450-1-1450-*n* and a corresponding one of the current sink path selector switches 1320-1-1320-*n*.

For example, by closing a first MOSFET source path switch 1450-1 and the corresponding first current sink path selector switch 1320-1 (and closing the other MOSFET source path switches 1450-2-1450-*n* and the other current sink path selector switches 1320-2-1320-*n*), the first resistor string node 1250-1 is coupled to the MOSFET device 1442 and the current sink 1310, such that the constant DC voltage VCM develops at the first resistor string node 1250-1 and the series combination of all of the resistors 1244-1-1244-*n* acts as the auxiliary current sense resistor. A feedback signal is supplied to the non-inverting input of the amplifier circuitry 1220 via the feedback path 1432, to permit regulation of the voltage at the first resistor string node 1250-1.

Similarly, by closing a second MOSFET source path switch 1450-2 and the corresponding second current sink path selector switch 1320-2 (and opening the other MOSFET source path switches 1450-1-1450-*n* and the other current sink path selector switches 1320-1-1320-*n*), the second resistor string node 1250-2 is coupled to the NMOS device 1442 and the current sink 1310, such that the constant DC voltage VCM develops at the second resistor string node 1250-2, and the series combination of the resistors 1244-2-1244-*n* acts as the auxiliary current sense resistor. Again, a feedback signal is supplied to the non-inverting input of the amplifier circuitry 1220 via the feedback path 1432 to permit regulation of the voltage at the second resistor string node 1250-2.

By using a single MOSFET device 1442 that can be selectively coupled to the current sink 1310 in this way, the total area of the circuitry 1400 is reduced, in comparison with the circuitry 1300 of FIG. 13. Like the circuitry 1200 and 1300, the circuitry 1400 does not include any switches in the auxiliary signal path, and thus does not adversely affect the accuracy of current measurements.

The presence of the auxiliary current sense resistor 1034 in the auxiliary signal path 1032 (whether implemented as a single resistor as in the circuitry 1000 of FIG. 10, as a resistor selected from a plurality of resistors 1134-1-1134-*n*, as in the circuitry 1100 of FIG. 11, or as a series combination of resistances, as in the circuitry 1200-1400 of FIGS. 12-14) will have an impact on a feedback loop of the primary driver circuitry 1020, because the signal across the auxiliary current sense resistor 1034 modulates the feedback of the primary driver circuitry, thus altering its feedback and stability behaviour. This alteration of the feedback and stability behaviour of the primary driver circuitry 1020 limits the maximum resistance of the auxiliary current sense resistor 1034 that can be tolerated by the system.

Figure 15:
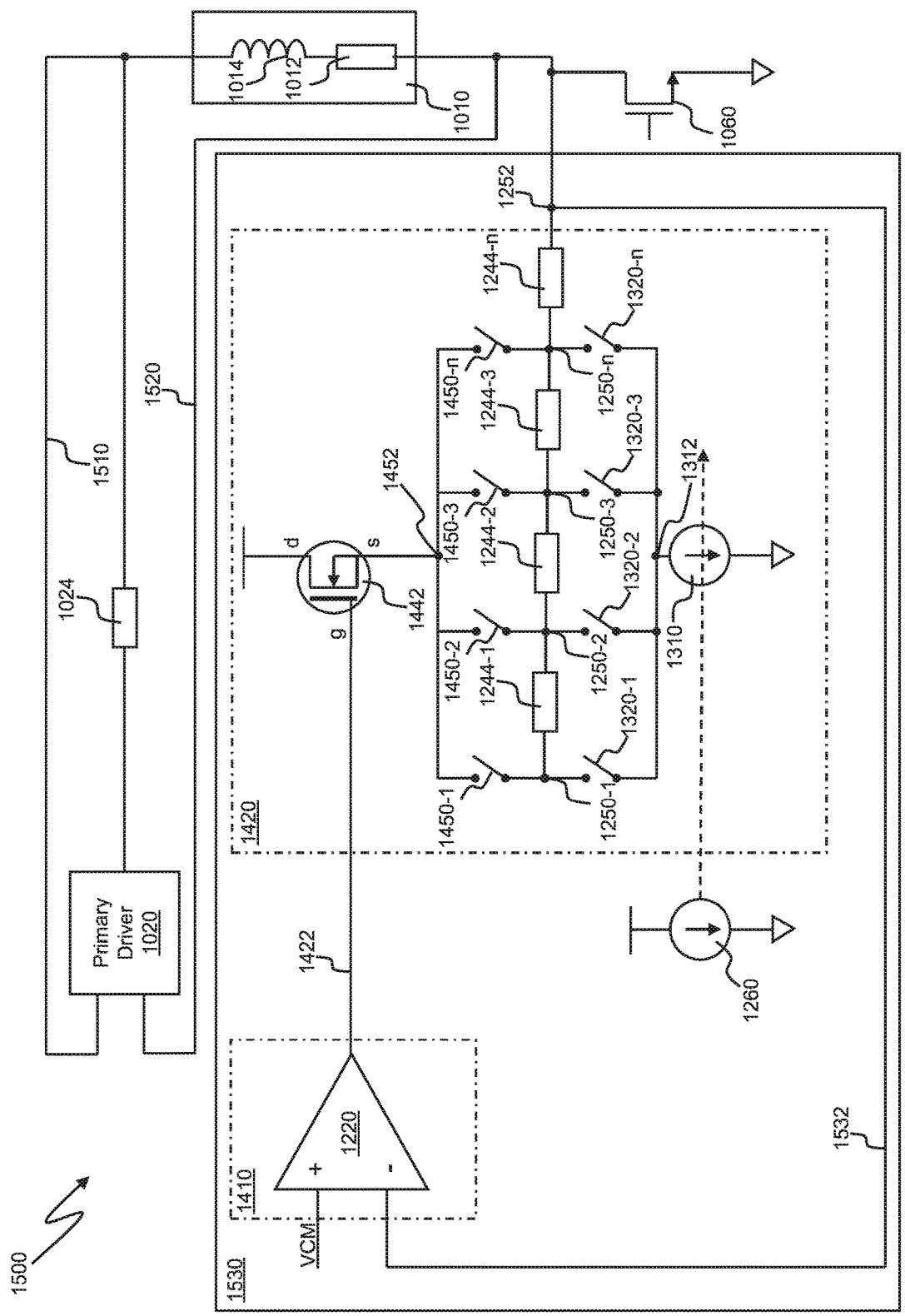
FIG. 15 is a schematic diagram showing alternative circuitry for driving a load according to the present disclosure.

FIG. 15 is a schematic diagram showing alternative circuitry for driving a load according to the present disclosure. The circuitry, shown generally at 1500 in FIG. 15, shares a number of elements in common with the circuitry 1000, 1400 of FIGS. 10 and 14. Such common elements are denoted by common reference numerals and will not be described in detail here.

The circuitry 1500 includes auxiliary driver circuitry 1530, which in this example comprises voltage driver circuitry comprising an input stage 1410 and an output stage 1420 of the kind described above with reference to FIG. 14.

The circuitry 1500 includes a first primary driver feedback path 1510 coupled between a first terminal of the load 1010 and a first input of the primary driver circuitry 1020, and a second primary driver feedback path 1520 coupled between a second terminal of the load 1010 and a second input of the primary driver circuitry 1020.

Because the resistors 1244-1-1244 of the auxiliary driver circuitry 1530 are coupled to the second terminal of the load 1010, during operation of the circuitry 1500 in its normal mode, a signal can develop across the resistors 1244-1-1244-*n* which modulates the feedback of the primary driver circuitry 1020. As described above, this modulation of the feedback of the primary driver circuitry 1020 alters its feedback and stability behaviour and limits the maximum resistance of the auxiliary current sense resistor (which is implemented in this example by the resistors 1244-1-1244-*n*).

To alleviate this, the auxiliary driver circuitry 1530 includes a feedback path 1532 that couples the resistor string output node 1252 to the inverting input of the amplifier circuitry 1200 of the auxiliary driver circuitry 1530, such that the resistors 1244-1-1244-n are included in the feedback loop of the auxiliary driver circuitry 1530. The output of the auxiliary driver circuitry 1530 is thus directly connected to the primary driver circuitry 1020, and the primary driver circuitry 1020 sees a stable DC signal. The modulating signal is absorbed by the auxiliary driver circuitry 1530, and this ensures that the primary driver circuitry 1020 is unaffected by the presence of the auxiliary current sense resistor (implemented in this example by the series combination of the resistors 1244-1-1244-n) in the auxiliary signal path, which increases the maximum resistance of the auxiliary current sense resistor that can be tolerated by the system. This in turn permits the option of using a higher resistance value for the auxiliary current sense resistor to improve a dynamic range of the system.

Figure 16:
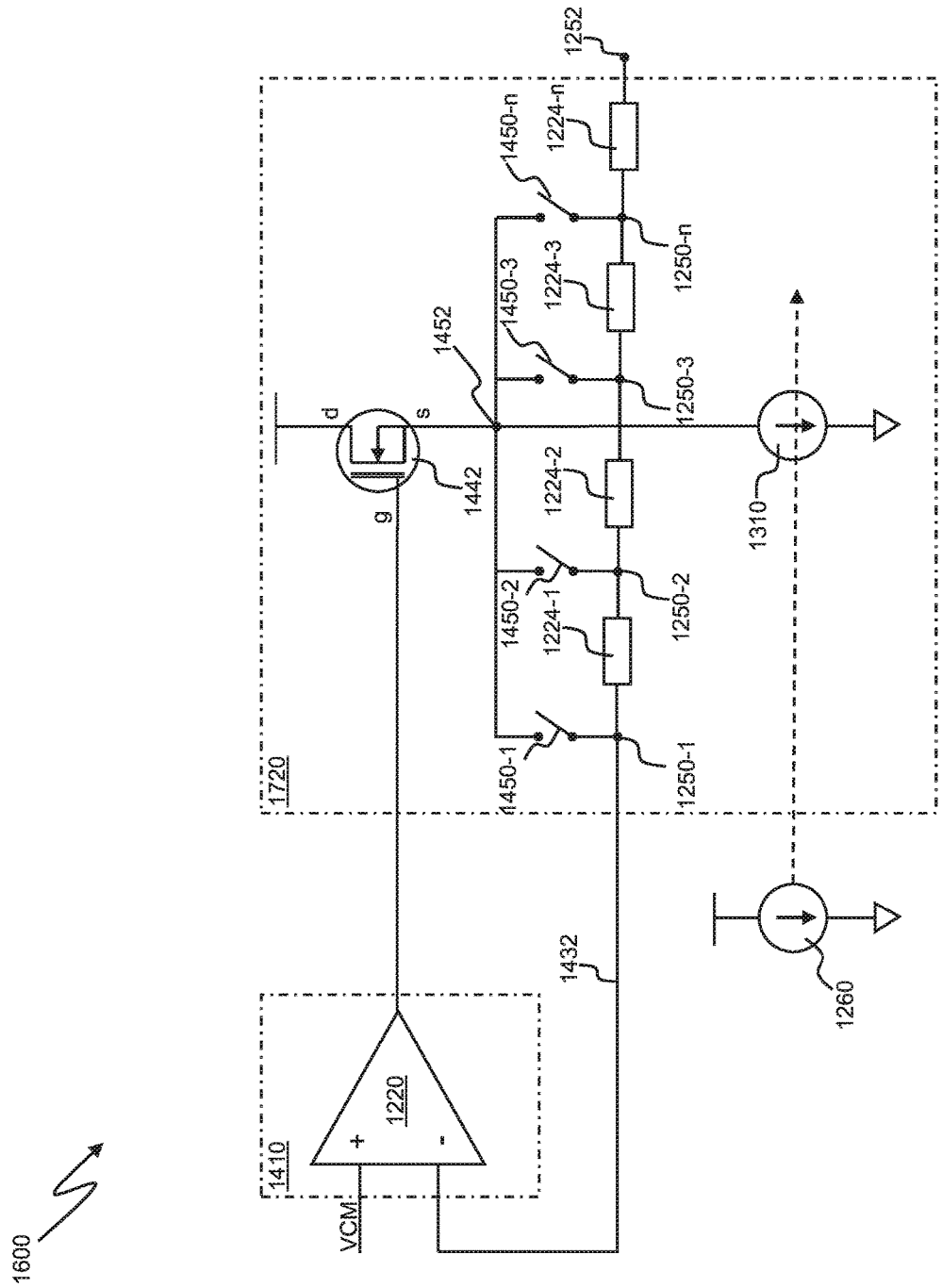
FIG. 16 is a schematic diagram showing further alternative example voltage driver circuitry for use as the auxiliary driver circuitry in the circuitry of FIG. 10.

FIG. 16 is a schematic diagram showing alternative example voltage driver circuitry for use as the auxiliary driver circuitry 1030 in the circuitry 1000 of FIG. 10, which provides a plurality of selectable resistances without requiring any switches in the auxiliary signal path. The circuitry, shown generally at 1600 in FIG. 16, shares a number of elements in common with the circuitry 1400 of FIG. 14. Such common elements are denoted by common reference numerals and will not be described in detail here.

The circuitry 1600 includes an input stage 1410 of the kind described above with reference to FIG. 14, and an output stage 1720.

The circuitry 1600 differs from the circuitry 1400 of FIG. 14 in that its output stage 1720 does not include the plurality of current sink path selector switches 1320-1-1320-n. Instead, the current sink 1310 is coupled between the source terminal of the MOSFET device 1442 and ground (or some other reference voltage supply).

The circuitry 1600 operates in substantially the same manner as the circuitry 1400 described above, with the exception that, as there are no current sink path selector switches 1320-1-1320-n, there is no need to close any current sink path selector switch. Thus, one of the MOSFET source path selector switches 1450-1-1450-n is closed, and the constant DC voltage VCM develops at the corresponding one of the resistor string nodes 1450-1-1450-n and is supplied to the second terminal of the load 1010.

As in the circuitry 1400 of FIG. 14, in the example circuitry 1600 shown in FIG. 16 the feedback path 1432 is coupled between the first resistor string node 1250-1 and the inverting input of the amplifier circuitry 1220. However in an alternative example, a feedback path could instead be provided between the resistor string output node 1252 and the inverting input of the amplifier circuitry 1220 (as in the circuitry 1500 of FIG. 15), such that the resistors 1224-1-1224-n are included in the feedback loop of the auxiliary driver circuitry, to mitigate modulation of the feedback to the primary driver circuitry 1020, as described above with reference to FIG. 15. In a further alternative example, a feedback path could be provided between an intermediate resistor string node (e.g. the second resistor string node 1250-2 or the third resistor string node 1250-3) and the inverting input of the amplifier circuitry 1220.

As will be apparent from the foregoing discussion, the circuitry of the present disclosure provides an auxiliary low-power current measurement path for driver circuitry that drives a load such as a speaker or haptic actuator (e.g. a linear resonant actuator). The auxiliary current measurement path can be used to supply a pilot signal to the load and the load current can be measured while the load is being driven by the pilot signal. This measured load current can be used, in combination with a measured load voltage, to calculate, estimate or otherwise determine the impedance of the load. The determined impedance of the load can be used for a variety of purposes. For example, where the load is a linear resonant actuator, the determined impedance may be used to estimate the position or displacement of a mass of the linear resonant actuator.

Embodiments may be implemented as an integrated circuit which in some examples could be a codec or audio DSP or similar. Embodiments may be incorporated in an electronic device, which may for example be a portable device and/or a device operable with battery power. The device may be, for example, a computer game controller, a virtual reality (VR) or augmented reality (AR) device, eyewear, a communication device such as a mobile telephone or smartphone or similar, a tablet, notebook or laptop computer, an accessory device to be used with some other product, headphones, earphones or earbuds, a headset, a wearable device such as a smartwatch, a device with voice control or voice activation functionality such as a smart speaker.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a transducer to generate a transducer output, the circuitry comprising:
   primary driver circuitry comprising a primary amplifier output stage coupled to a primary signal path and operable to output a playback signal to the transducer in a first mode of operation of the circuitry, wherein a playback signal comprises a signal that drives the transducer to generate the transducer output;
   auxiliary driver circuitry comprising an auxiliary amplifier output stage coupled to an auxiliary signal path;
   an auxiliary current sense resistor in the auxiliary signal path; and
   current detection circuitry coupled to the auxiliary current sense resistor and configured to generate a signal indicative of a current through the transducer,
   wherein one of the primary driver circuitry and the auxiliary driver circuitry is operable to output a pilot signal to the transducer in a second mode of operation of the circuitry, wherein a pilot signal comprises a signal having a predefined frequency or frequency content and a predefined magnitude, and wherein a magnitude of the pilot signal is lower than a magnitude of the playback signal.

2. Circuitry according to claim 1, wherein the other of the primary driver circuitry and the auxiliary driver circuitry is operable to output a constant DC signal in the second mode of operation of the circuitry.

3. Circuitry according to claim 1, further comprising a primary current sense resistor in the primary signal path, wherein the auxiliary current sense resistor has a higher resistance than the primary current sense resistor.

4. Circuitry according to claim 1, wherein in the first mode of operation the auxiliary signal path is set to a high impedance state, and wherein in the second mode of operation the primary signal path is set to a high impedance state.

5. Circuitry according to claim 1, wherein the primary driver circuitry comprises Class D output stage circuitry.

6. Circuitry according to claim 5, wherein the auxiliary signal path comprises a switch for isolating the auxiliary signal path from the primary signal path.

7. Circuitry according to claim 5, wherein a bulk node of an NMOS device of the Class D output stage circuitry is back-biased in the first mode of operation.

8. Circuitry according to claim 1, wherein the circuitry includes a plurality of resistors, each having a different resistance, for use as the auxiliary current sense resistor, wherein the plurality of resistors are selectively couplable to the auxiliary signal path.

9. Circuitry according to claim 8, wherein the circuitry includes a plurality of instances of auxiliary driver circuitry, each instance of auxiliary driver circuitry being coupled to a respective auxiliary signal path, and wherein each auxiliary signal path includes a respective one of the plurality of resistors.

10. Circuitry according to claim 1, wherein the circuitry further comprises additional high impedance driver circuitry configured to supply a DC current to the transducer in operation of the circuitry in the second mode.

11. Circuitry according to claim 1, wherein an output node of the primary signal path is coupled, in use, to a first terminal of the transducer, and wherein an output node of the auxiliary driver circuitry is coupled, in use, to a second terminal of the transducer.

12. Circuitry according to claim 11, further comprising a switch coupled, in use, between the second terminal of the transducer and a reference voltage supply, wherein in the first mode of operation the switch is closed to couple the second terminal of the transducer to the reference voltage supply, and wherein in the second mode of operation the switch is open.

13. Circuitry according to claim 12, wherein the auxiliary driver circuitry comprises voltage driver circuitry.

14. Circuitry according to claim 13, wherein the voltage driver circuitry comprises:
   amplifier circuitry having an input stage and an output stage, the output stage comprising a plurality of selectable output stage segments and a resistor string comprising a plurality of series-connected resistors.

15. Circuitry according to claim 1, further comprising:
voltage detection circuitry configured to generate a signal indicative of a voltage across the transducer; and
impedance measurement circuitry configured to calculate, estimate or otherwise determine an impedance of the transducer based on the signal indicative of the voltage across the transducer and the signal indicative of the current through the transducer; and/or
inductance measurement circuitry configured to calculate, estimate or otherwise determine an inductance of the transducer based on the signal indicative of the voltage across the transducer and the signal indicative of the current through the transducer.

16. An integrated circuit comprising the circuitry of claim 1.

17. A device comprising the circuitry of claim 1, wherein the device comprises a portable device, a battery powered device, a mobile telephone, a tablet, notebook or laptop computer, a smart speaker, an accessory device, a headset device, smart glasses, headphones, earphones or earbuds, a computer game controller, a virtual reality (VR) or augmented reality (AR) device, eyewear, a wearable device such as a smartwatch, a device with voice control or voice activation functionality, or a smart speaker.

18. Circuitry for driving a transducer to generate a transducer output, the circuitry comprising:
primary driver circuitry comprising a primary amplifier output stage coupled to a primary signal path and operable to supply a primary signal to a first terminal of the transducer in a first mode of operation of the circuitry and to supply a measurement signal to the first terminal of the transducer in a second mode of operation of the circuitry;
auxiliary driver circuitry coupled comprising an auxiliary amplifier output stage to an auxiliary signal path and operable to supply a constant DC voltage to a second terminal of the transducer in the second mode of operation of the circuitry, wherein the auxiliary signal path comprises a variable auxiliary current sense resistor; and
current detection circuitry coupled to the variable auxiliary current sense resistor and configured to generate a signal indicative of a current through the load in the second mode;
wherein a magnitude of the measurement signal is lower than a magnitude of the primary signal.

19. Circuitry for driving a transducer to generate a transducer output, the circuitry comprising:
primary driver circuitry comprising a primary amplifier output stage coupled to a primary signal path and operable to drive the transducer with a primary signal in a first mode of operation;
auxiliary driver circuitry comprising an auxiliary output stage coupled to an auxiliary signal path and operable to drive the transducer with an auxiliary signal in a second mode of operation;
an auxiliary current sense resistor in the auxiliary signal path; and
current detection circuitry coupled to the auxiliary current sense resistor and configured to generate a signal indicative of a current through the transducer,
wherein the auxiliary driver circuitry is inoperative in the first mode of operation and the primary driver circuitry is inoperative in the second mode of operation;
wherein a magnitude of the auxiliary signal is lower than a magnitude of the primary signal.

\* \* \* \* \*